United States Patent

Sekiguchi et al.

[11] Patent Number: 6,060,352
[45] Date of Patent: May 9, 2000

[54] METHOD OF MANUFACTURING SEMICONDUCTOR DEVICE WITH INCREASED FOCUS MARGIN

[75] Inventors: Toshihiro Sekiguchi, Hidaka; Hideo Aoki, Hamura; Yoshitaka Tadaki, Hanno; Keizo Kawakita, Ome; Jun Murata, Kunitachi; Katsuo Yuhara, Ibaraki-ken; Michio Nishimura, Tokorozawa; Kazuhiko Saitoh, Ibaraki-ken; Minoru Ohtsuka, Fussa; Masayuki Yasuda, Kunitachi; Toshiyuki Kaeriyama; Songsu Cho, both of Ibaraki-ken, all of Japan

[73] Assignee: Hitachi, Ltd., Tokyo, Japan

[21] Appl. No.: 09/015,073

[22] Filed: Jan. 28, 1998

Related U.S. Application Data

[63] Continuation of application No. 08/694,766, Aug. 9, 1996, abandoned.

[51] Int. Cl.[7] .................................................. H01L 21/8242
[52] U.S. Cl. ........................................... 438/253; 438/637
[58] Field of Search ........................... 438/238, 253–256, 438/381, 393–399, 618, 620, 624, 626, 637, 638–640, 666

[56] References Cited

U.S. PATENT DOCUMENTS

| 5,188,975 | 2/1993 | Kojima et al. . | |
|---|---|---|---|
| 5,256,587 | 10/1993 | Jun et al. . | |
| 5,403,767 | 4/1995 | Kim | 438/254 |
| 5,521,112 | 5/1996 | Tseng | 438/253 |
| 5,597,754 | 1/1997 | Lou et al. . | |
| 5,620,917 | 4/1997 | Yoon et al. | 438/637 |

FOREIGN PATENT DOCUMENTS 7122654 of 0000 Japan .

*Primary Examiner*—Jey Tsai
*Attorney, Agent, or Firm*—Antonelli, Terry, Stout & Kraus, LLP

[57] ABSTRACT

A method for fabricating DRAMs each having a COB structure, and the semiconductor device formed by this method, are provided. In one embodiment, the word line and/or bit line is covered with an insulating film having a comparatively small etching rate. Contact holes are formed while being defined by those insulating films in self-alignment.

32 Claims, 30 Drawing Sheets

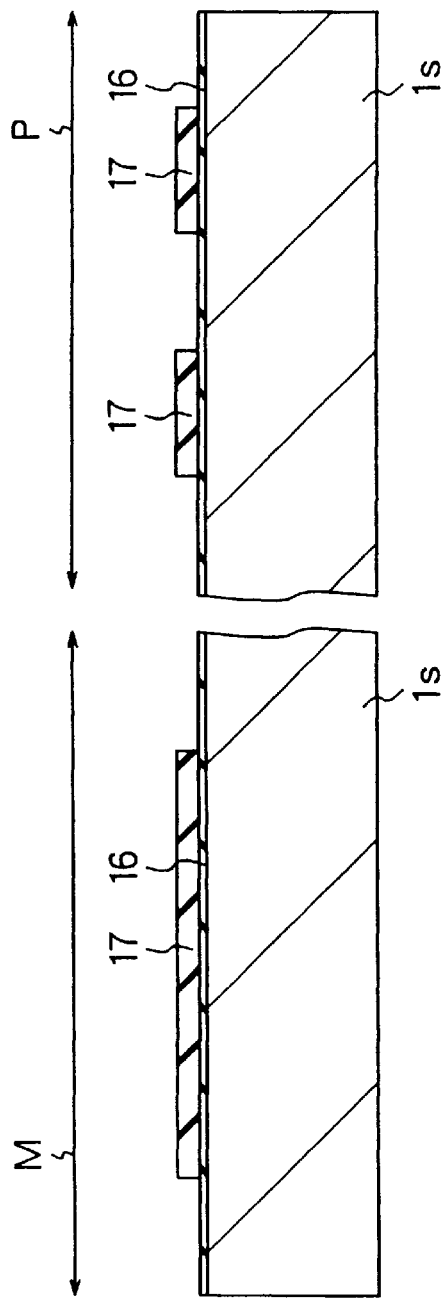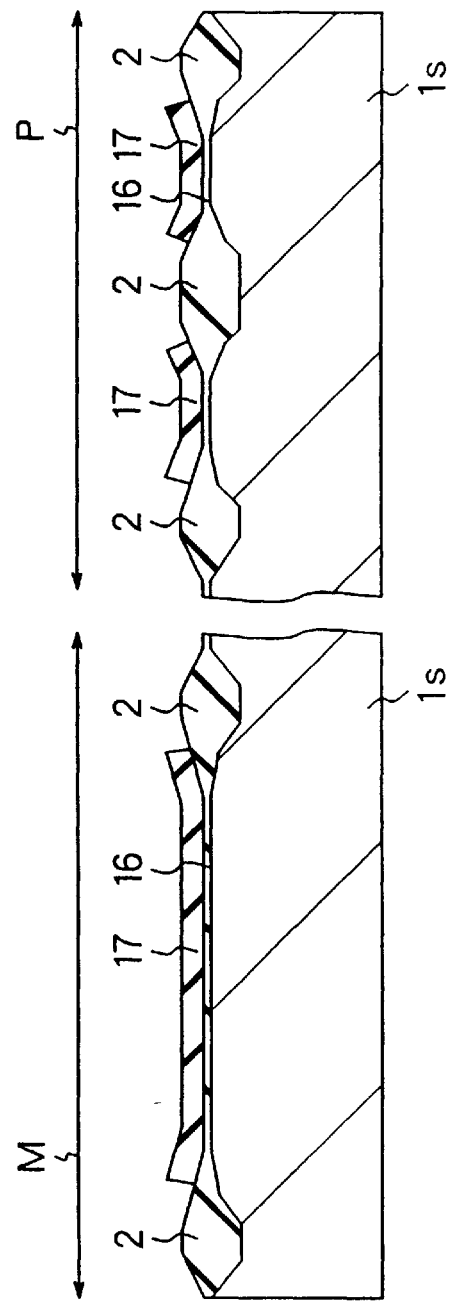

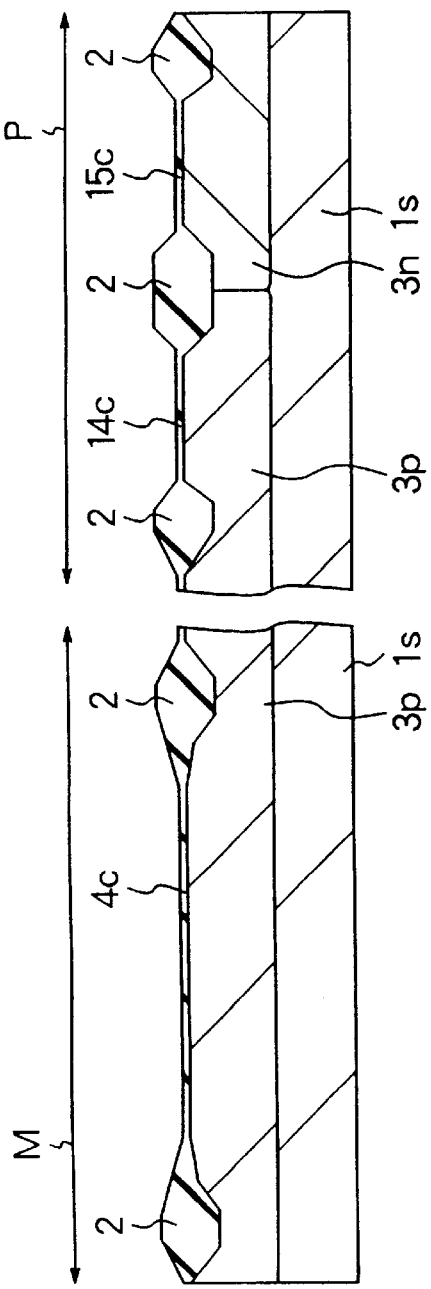
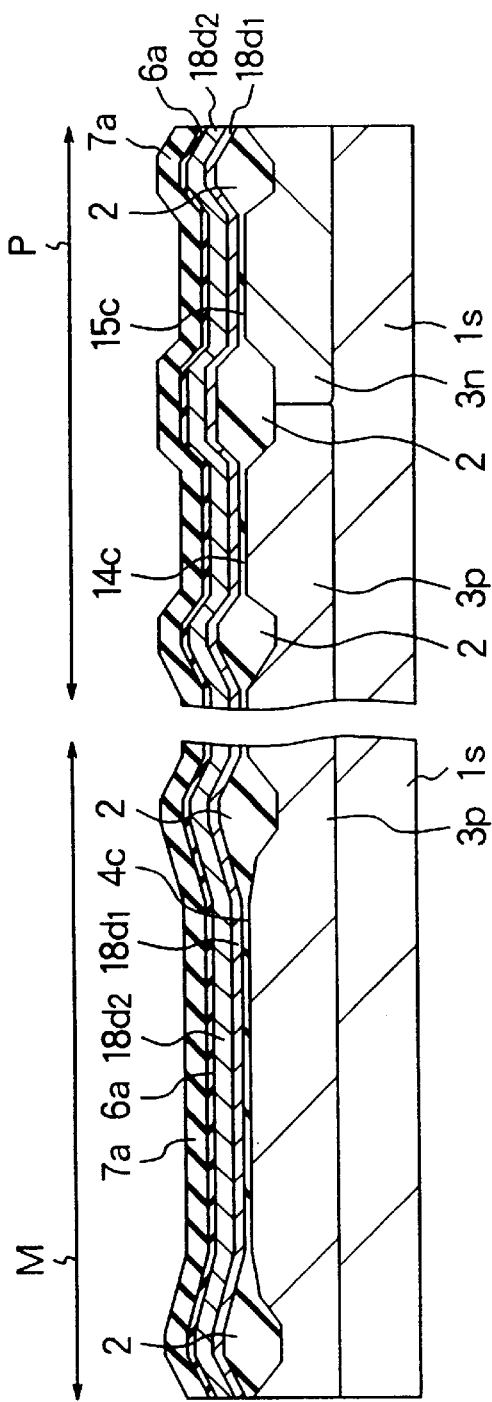

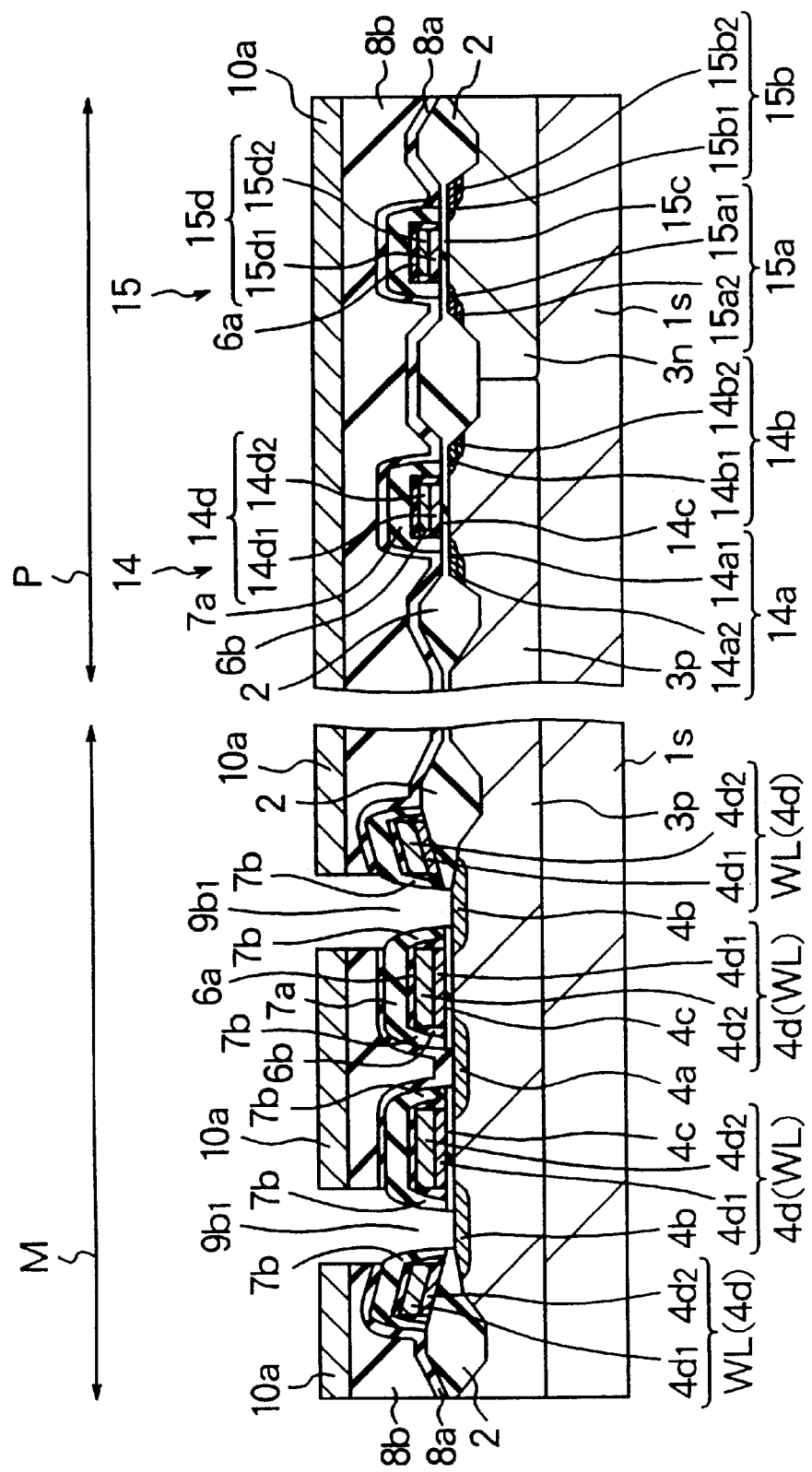

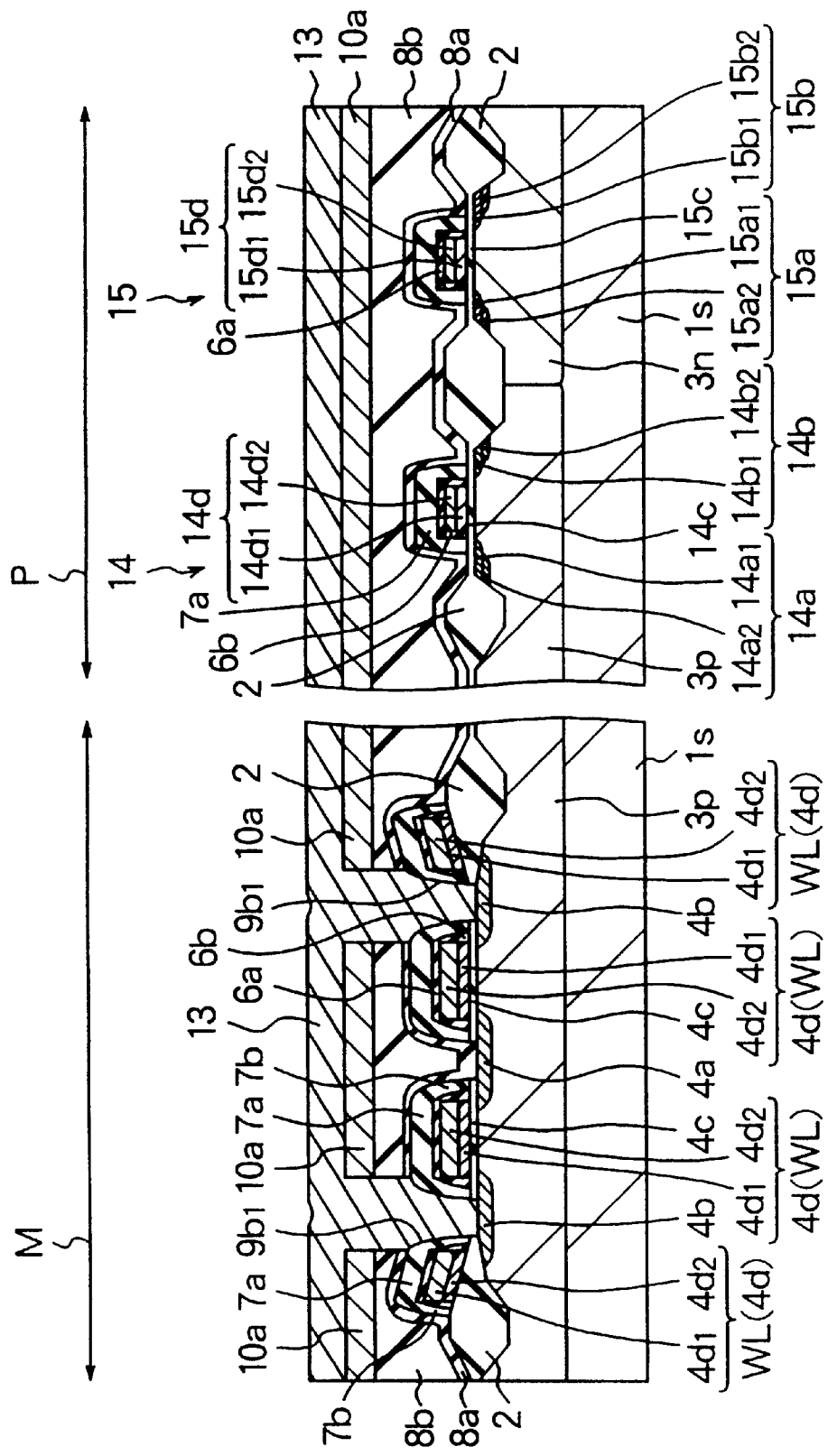

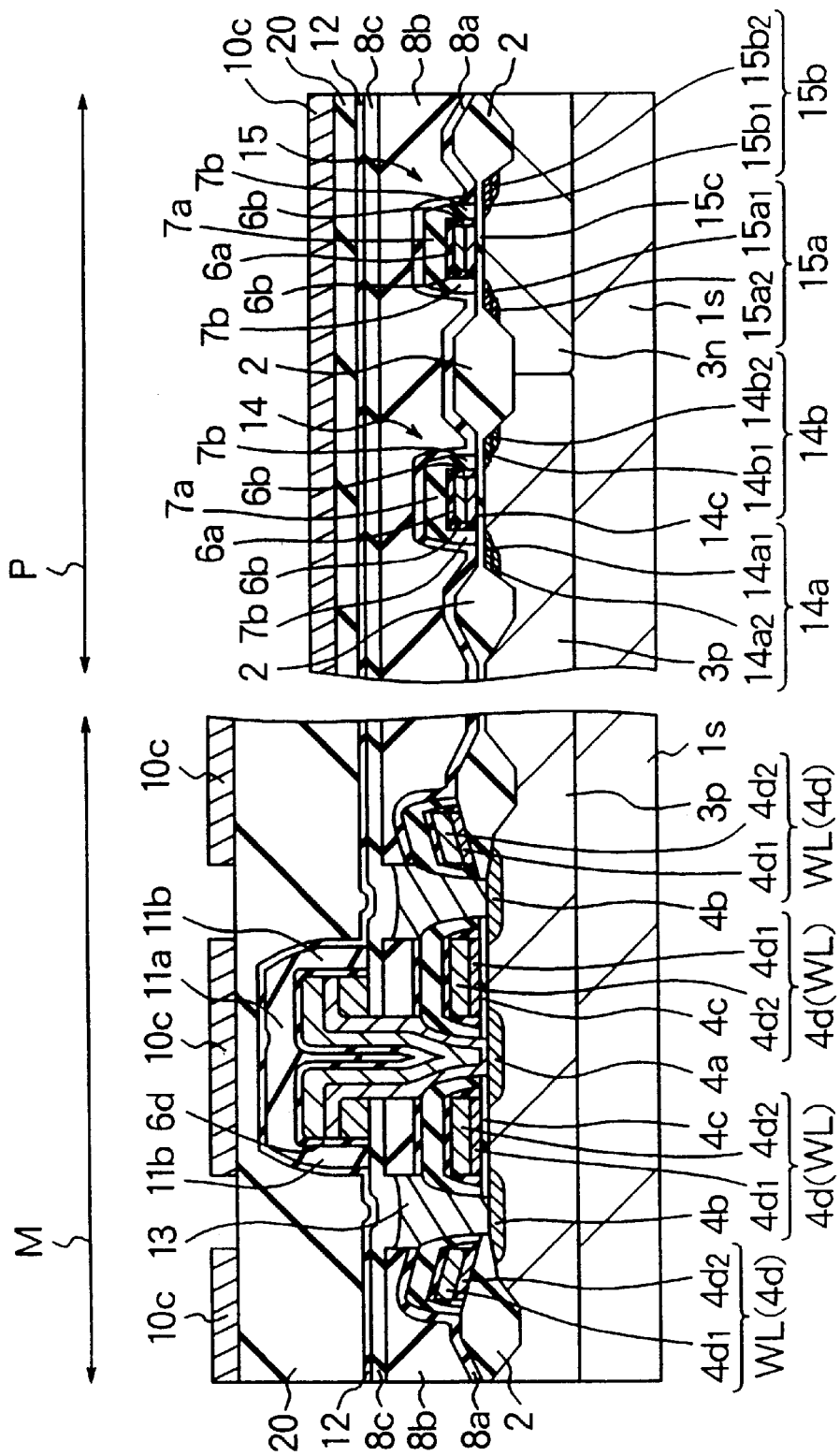

FIG. 5r1
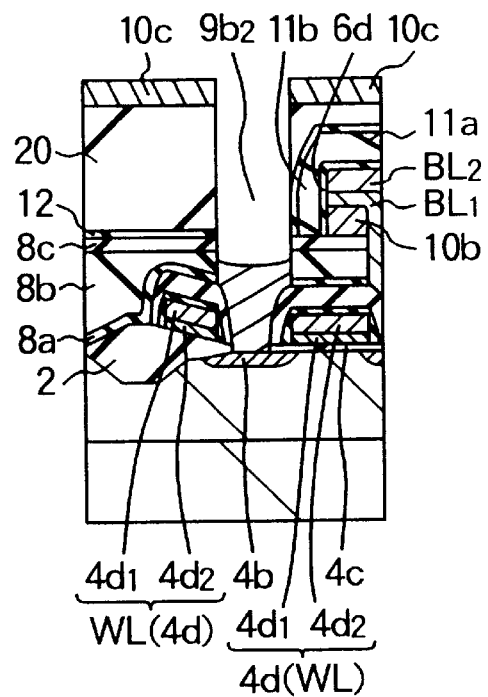
FIG. 5r2
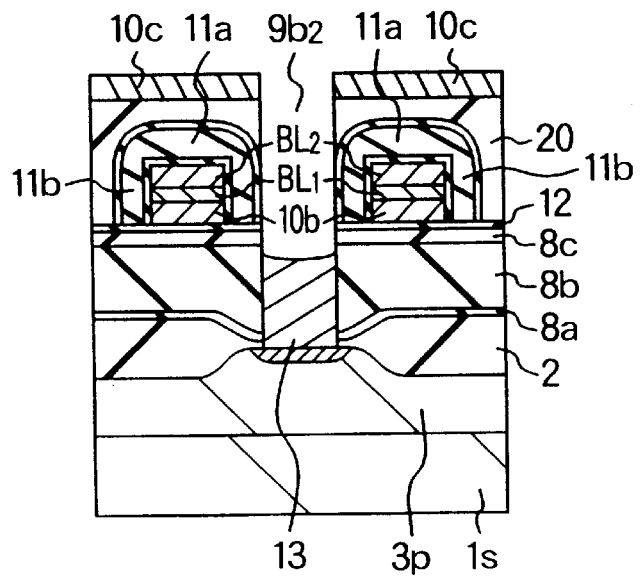

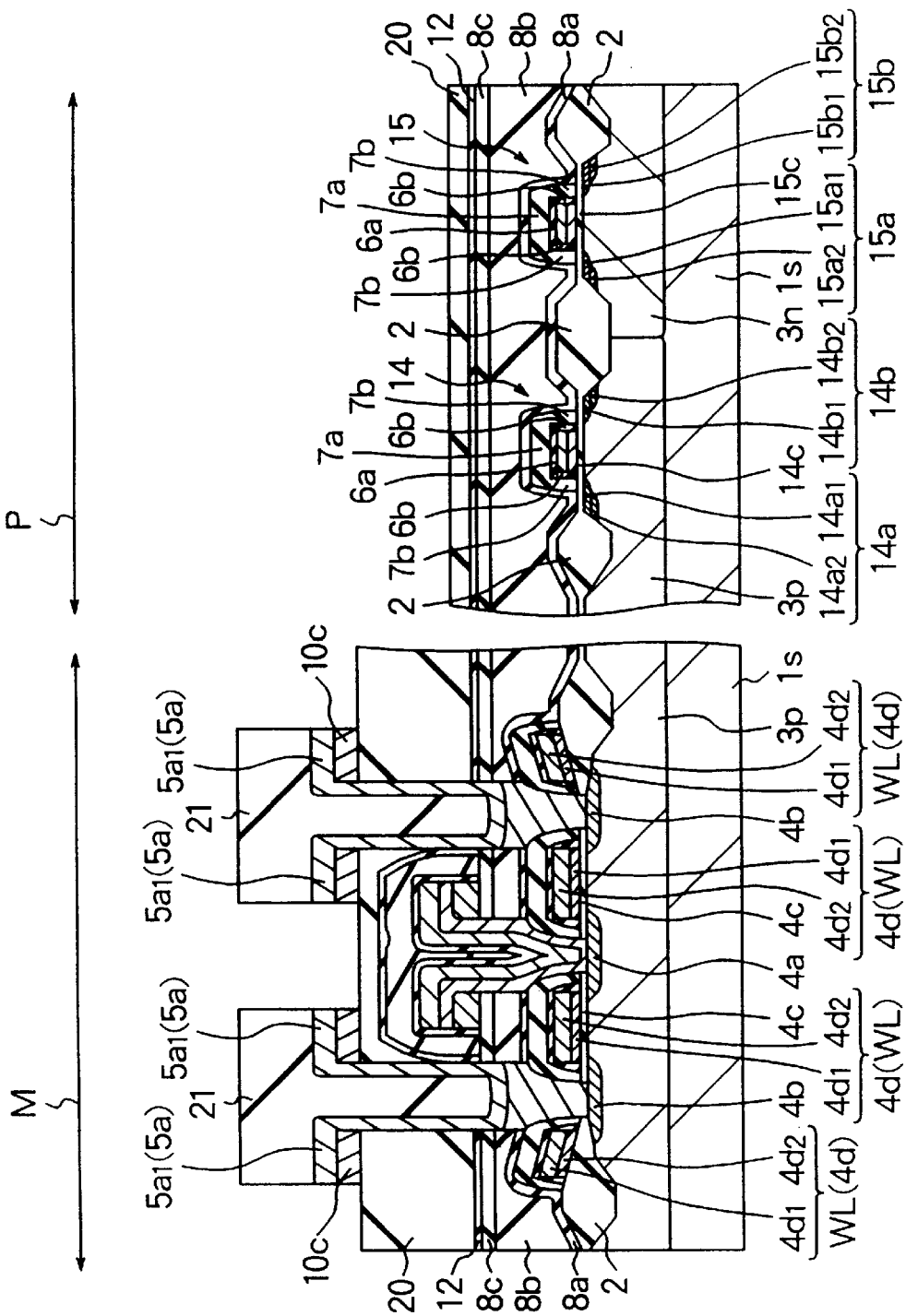

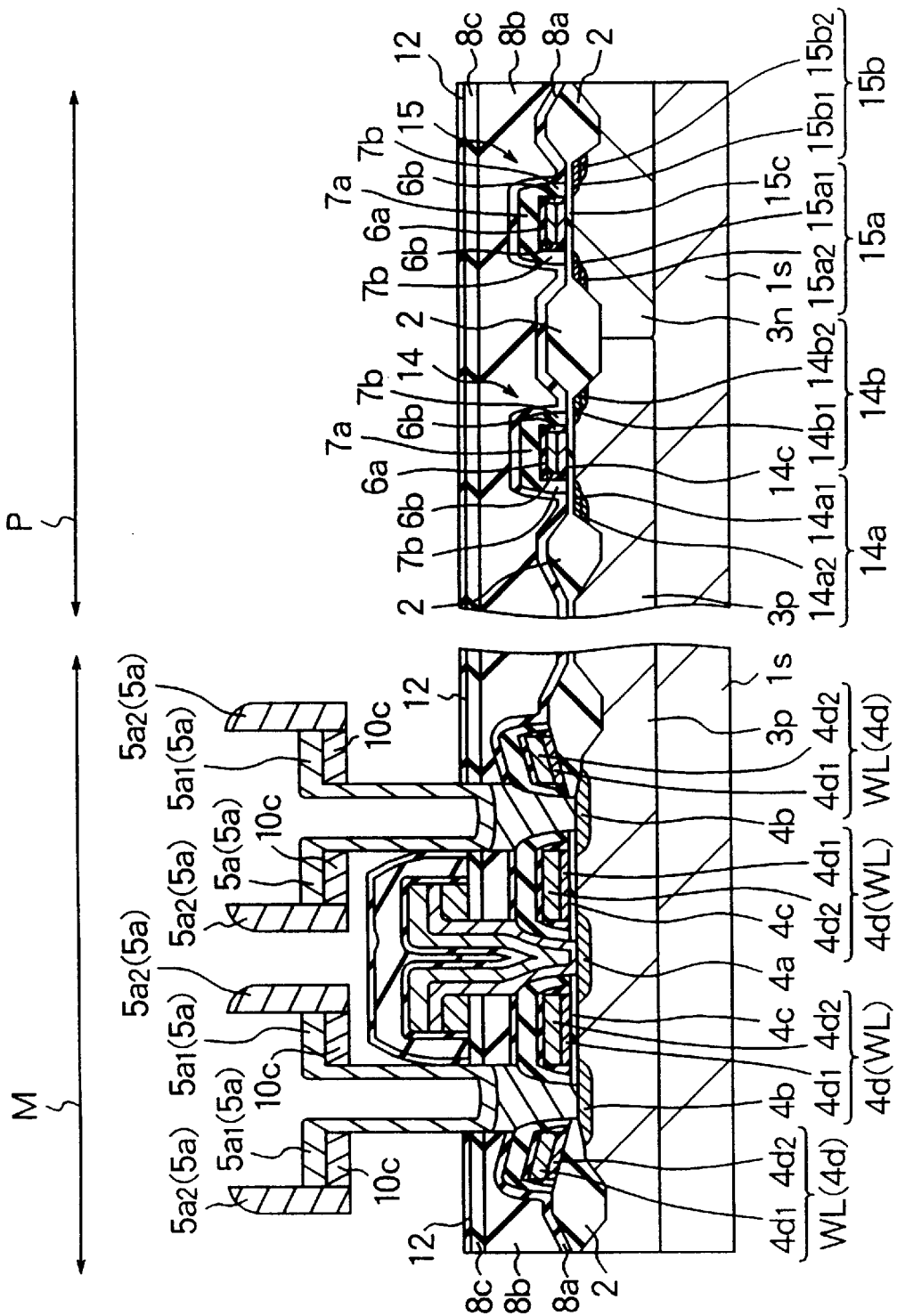

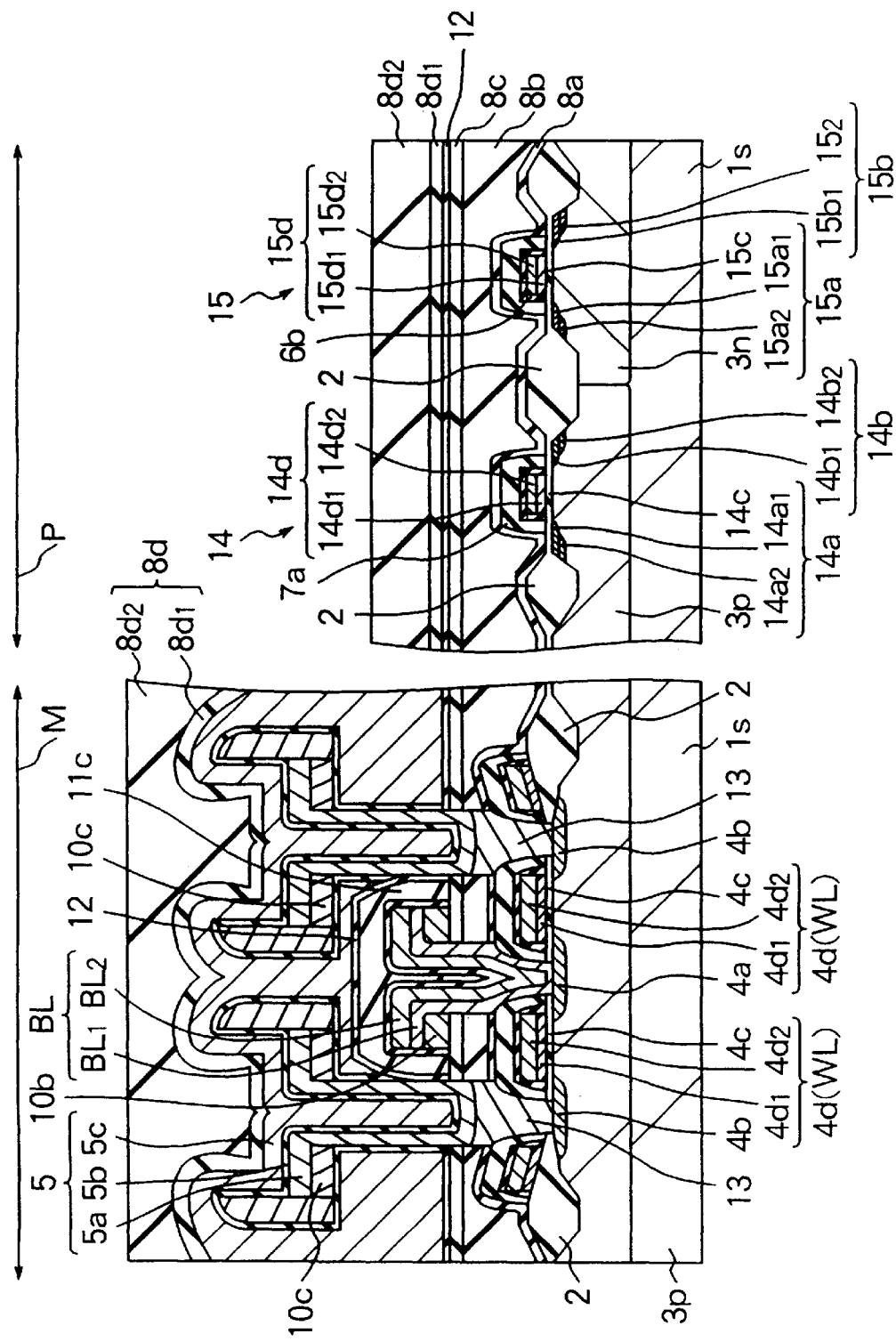

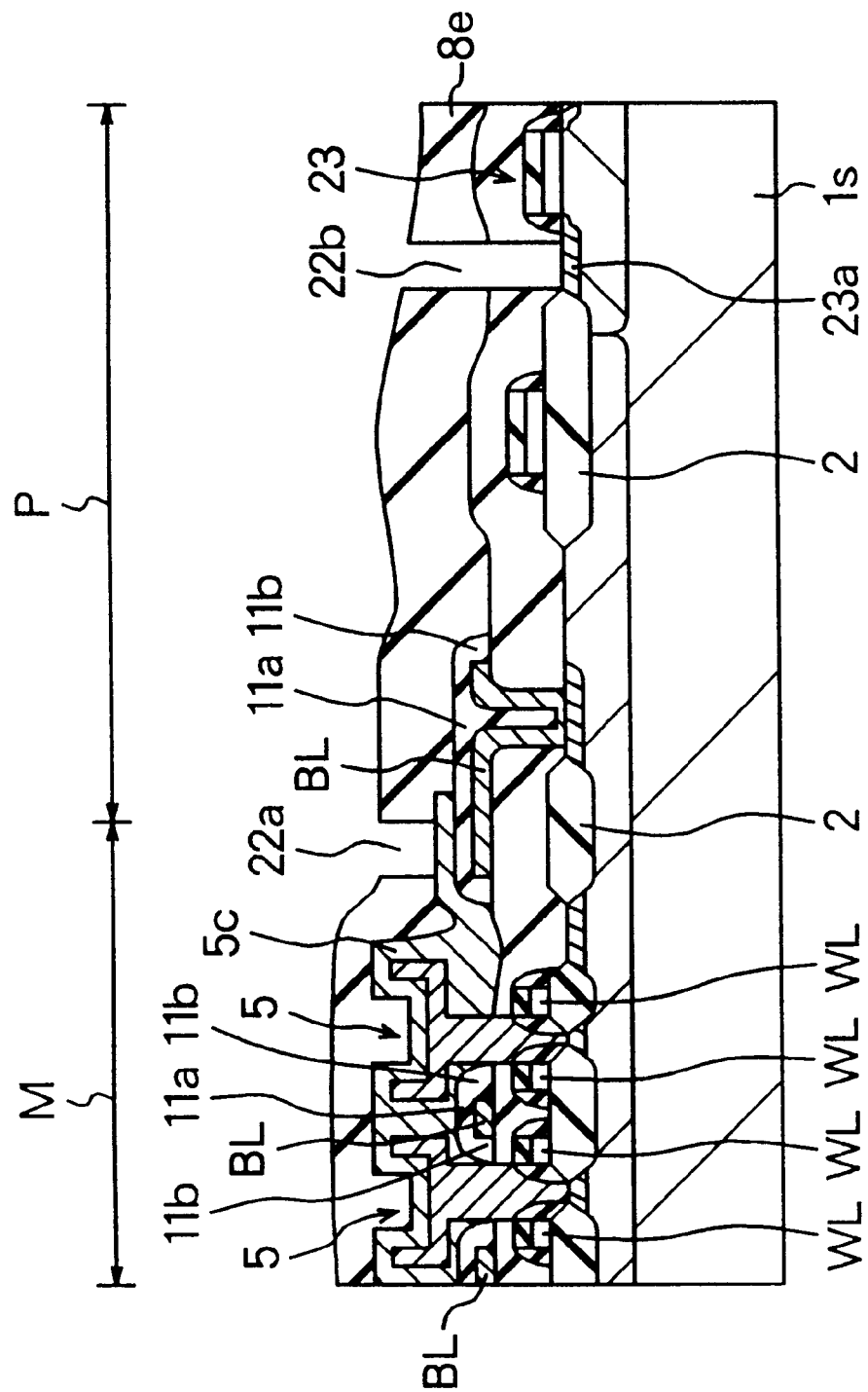

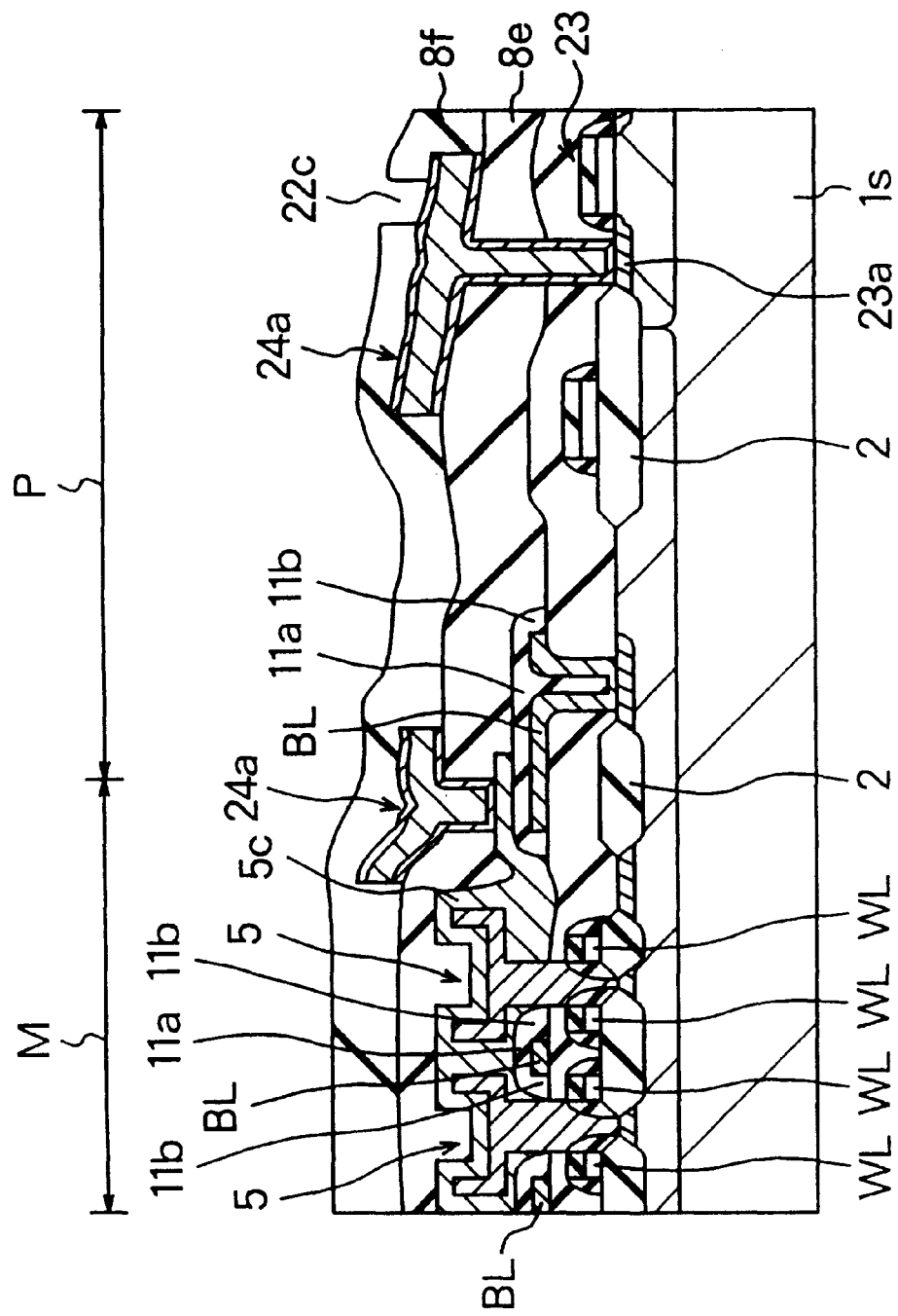

METHOD OF MANUFACTURING SEMICONDUCTOR DEVICE WITH INCREASED FOCUS MARGIN

This application is a Continuing application of prior application Ser. No. 08/694,766, filed Aug. 9, 1996, abandoned the contents of which are incorporated herein by reference in their entirety.

BACKGROUND OF THE INVENTION

The present invention relates to a technique for manufacturing semiconductor devices, and in particular to a method for manufacturing semiconductor devices having DRAMs (Dynamic Random Access Memories).

DRAMs are semiconductor memories representing large storage capacity memories. The DRAMs tend to have increasingly larger memory capacities. From the view point of increasing the degree of integration of the memory cells of DRAMs, therefore, the area occupied by memory cells cannot help being reduced.

For the information storage capacitors in memory cells of DRAMs, however, it is known that a predetermined capacitance will be needed irrespective of the memory generation from the view point of the operation margin and software errors of the DRAMs and the scaling rule cannot be typically applied thereto.

Therefore, a capacitor structure allowing securement of a needed capacitance within a small limited occupied area is now being develpoped. As such a capacitor structure, a three-dimensional capacitor structure such as a so-called stacked capacitor having a capacitive insulating film between two poly-silicon layers is adopted.

In a typical structure of the stacked capacitors, a capacitor electrode is disposed over a selective MOSFET (Metal Oxide Semiconductor Field Effect Transistor). In this case, large capacitance can be secured by using a small occupied area. In addition, no diffusion layers are needed in the configuration of the capacitor. Therefore, the occurrence rate of software errors can be significantly reduced, and the needed capacitance can be advantageously reduced.

Various types are included in such stacked capacitor structures. Among them, a capacitor is disposed over a bit line in a so-called capacitor over bit line (hereafter abbreviated to COB) structure. In the COB structure, the underlying step of a storage electrode (storage node) is eliminated by the bit line. Therefore, the burden imposed on the process in forming the capacitor is advantageously reduced. Furthermore, since the bit line is shielded by the capacitor, a high signal-to-noise ratio value is advantageously obtained. By the way, a DRAM having a memory cell of a COB structure is described in JP-A-7-122654 published in May 12, 1995, for example.

SUMMARY OF THE INVENTION

However, the present inventors found that DRAMs having such a COB structure had problems described below.

Bit line contact holes and capacitor storage node contact holes need alignment tolerance respectively with respect to a word line and the bit line, allowing for mis-alignment caused when those holes are formed. This results in a problem that the cell size of a memory cell cannot be made sufficiently small.

Solution to such a problem of alignment tolerance has depended upon the advance of the alignment precision technique of photolithography. For raising the degree of integration, however, a sophisticated alignment technique and process control are needed. In addition, it becomes necessary to introduce a sophisticated expensive photolithography technique such as a phase shift exposure technique in order to improve the resolution of transcription patterns. In addition, it takes time and labor to newly introduce those techniques into the process for manufacturing semiconductor devices, resulting in a problem of prolonged turn-around time of semiconductor devices.

As the phase shift exposure technique for forming contact holes, there are the outrigger phase-shift exposure and attenuated phase-shift exposure. In the outrigger phase-shift exposure, an auxiliary light transmitting region which is not in fact transcribed (hereafter referred to as auxiliary pattern) is disposed around a light transmitting region for a transcription pattern (hereafter referred to as principal pattern) and a phase difference is caused between light beams transmitted through the primary pattern and the auxiliary pattern, thereby edges in the image of light transmitted through the mask being emphasized. In the attenuated phase-shift exposure, the opaque portion of the mask is provided with slight transparency to cause a phase difference between light beams transmitted through the mask and emphasize edges of the image of light.

In the case of the outrigger phase-shift exposure, however, the design of the auxiliary pattern for obtaining a sufficient exposure intensity ratio and the adequate disposition become difficult as the diameter of the contact holes and the spacing between adjacent contact holes are reduced. Especially in the memory cell region of DRAMs, the contact holes are disposed with a high density and the spacing between adjacent contact holes tends to be decresed. In the memory cell region, therefore, disposition of the above described auxiliary pattern is difficult and there is a limit in implementing a finer configuration. In the case of the attenuated phase shift exposure, a pattern larger than the opening diameter of the contact holes actually opened needs to be opened on the mask, and consequently restrictions are placed on disposition of adjacent contact holes, implementation of a finer configuration being thus implemented.

An object of the present invention is to reduce the alignment tolerance for contact holes in semiconductor devices such as DRAMs having COB structures.

Another object of the present invention is to reduce the size of semiconductor devices.

Another object of the present invention is to reduce the size of semiconductor devices even in the case where any sophisticated lithography technique or any sophisticated alignment technique is not introduced.

Still another object of the present invention is to provide a technique capable of shortening the turn-around time of semiconductor devices equipped with a DRAM having a COB structure.

According to one aspect of the present invention, a method of manufacturing a semiconductor device comprising the steps of:

forming a plurality of wiring conductors over a semiconductor substrate;

covering upper and side surfaces of the wiring conductors with first insulating films;

forming a second insulating film on the resulting semicondutor substrate to cover therewith the first insulating film, the second insulating film having a flat upper surface and including a material larger in etching rate than a material of the first insulating film;

forming a mask film on the flat upper surface of the second insulating film, the mask film including a material smaller in etching rate than a material of the second insulating film, and thereafter forming openings in contact hole forming regions of the mask film located between the plurality of wiring conductors adjacent to each other; and forming contact holes by etching and removing a part of the second insulating film exposed in the opening regions of the mask film, the contact holes being defined by said first insulating film in self-alignment.

According to another aspect of the present invention, a method of manufacturing a semiconductor device comprises the following steps:

forming first conductors over a main surface of a semiconductor substrate with a first insulating film interposed therebetween;

forming semiconductor regions in the main surface of the semiconductor substrate on both sides of the first conductors;

covering upper and side surfaces of the first conductors with a second insulating film;

forming a third insulating film on the resulting substrate with the second insulating film being contacted with and underlying the third insulating film, the third insulating film having an etching rate larger than that of the second insulating film;

flattening an upper surface of the third insulating film; and forming first contact holes by etching through the third insulating film having the flattened upper surface for predetermined ones of the semiconductor regions, wherein the flattened upper surface of the third insulating film enhances a resolution for the first contact holes and the second insulating film serves to limit excessive etching for the first contact holes owing to its relatively lower etching rate.

According to another aspect of the present invention, a semiconductor device comprises:

a semiconductor substrate having a main surface;

wiring conductors formed spaced apart from each other over the main surface of the semiconductor substrate with a first insulating film interposed therebetween, side surfaces and upper surfaces of the wiring conductors being covered with a second insulating film;

a semiconductor region formed in the main surface of the semiconductor substrate between the wiring conductors;

an inter-layer insulating film formed on and contacted to the second insulating film and having an etching rate larger than that of the second insulating film, the inter-layer insulating film having a through hole therein cooperating with a space between the wiring conductors to form a contact hole for the semiconductor region; and a contact conductor provided in the contact hole.

BRIEF DESCRIPTION OF THE DRAWING

FIGS. 5a–5q, 5r1–5r2, 5s–5z are sectional views of a semiconductor device in respective stages of an embodiment of a method for manufacturing semiconductor devices according to the present invention;

DESCRIPTION OF THE PREFERRED EMBODIMENTS

Figure 1:
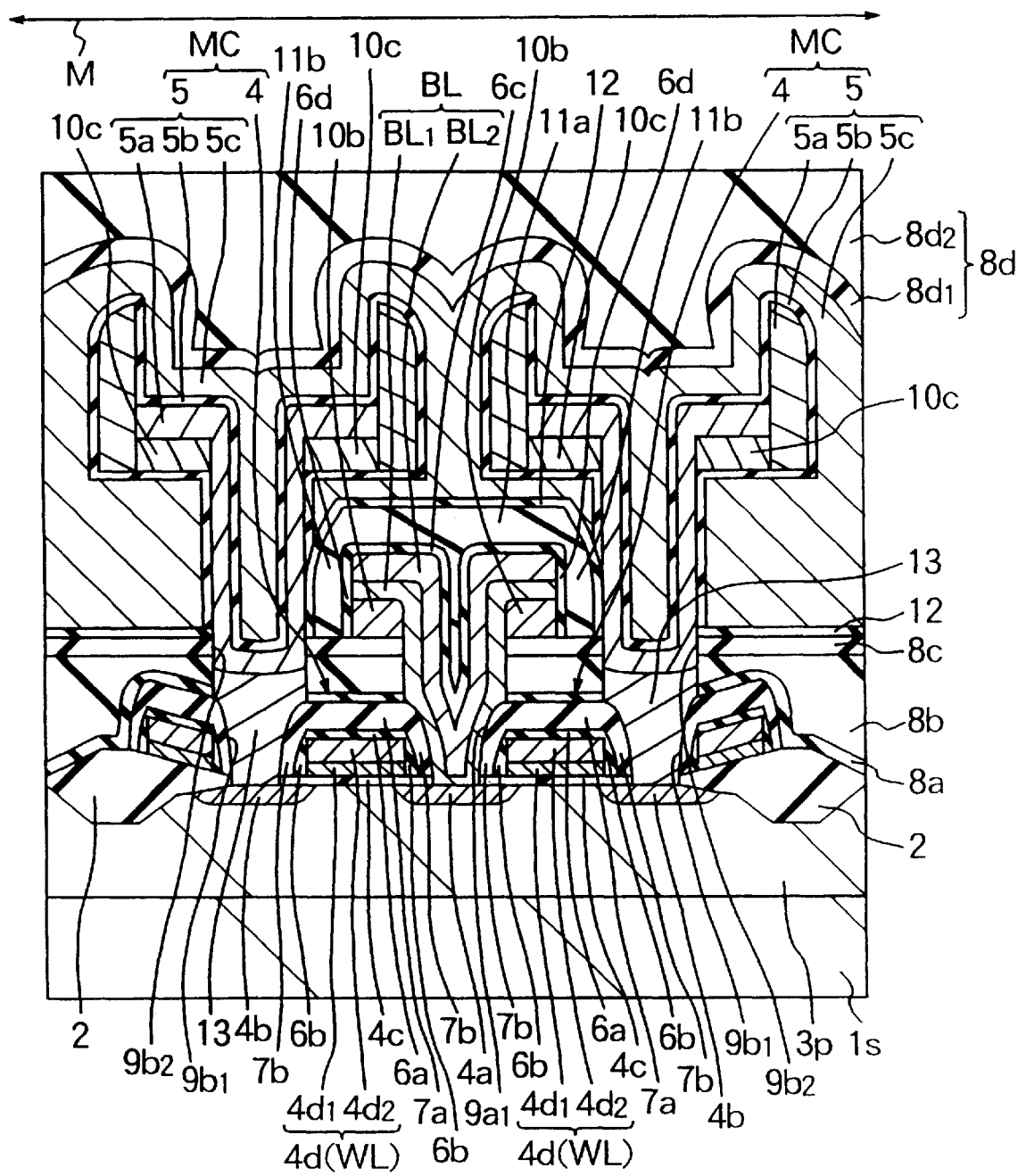
FIG. 1 is a sectional view of a principal portion of a memory cell region included in an embodiment of a semiconductor device according to the present invention.
Figure 2:
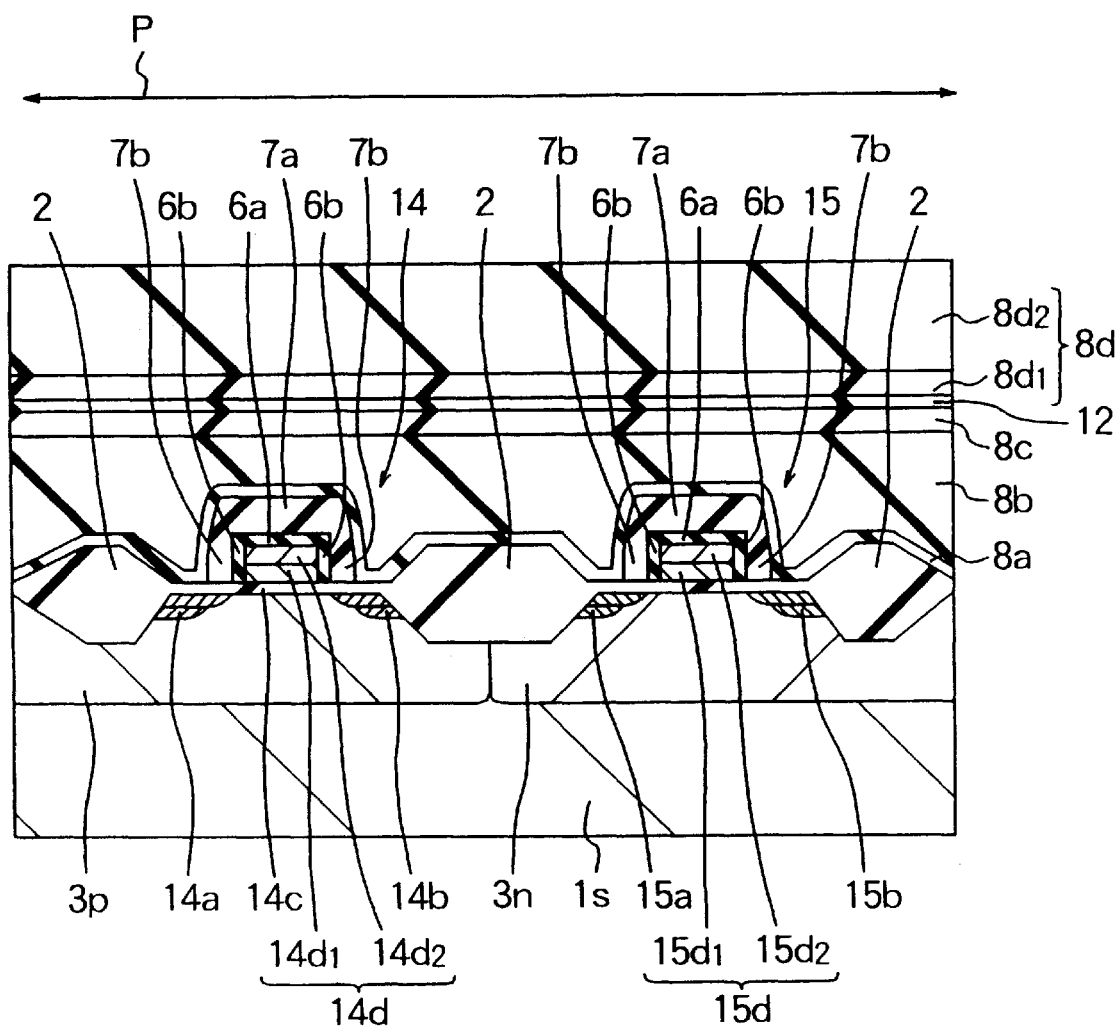
FIG. 2 is a sectional view of a principal portion of a peripheral circuit region for the memory cell illustrated in FIG. 1.
Figure 3:
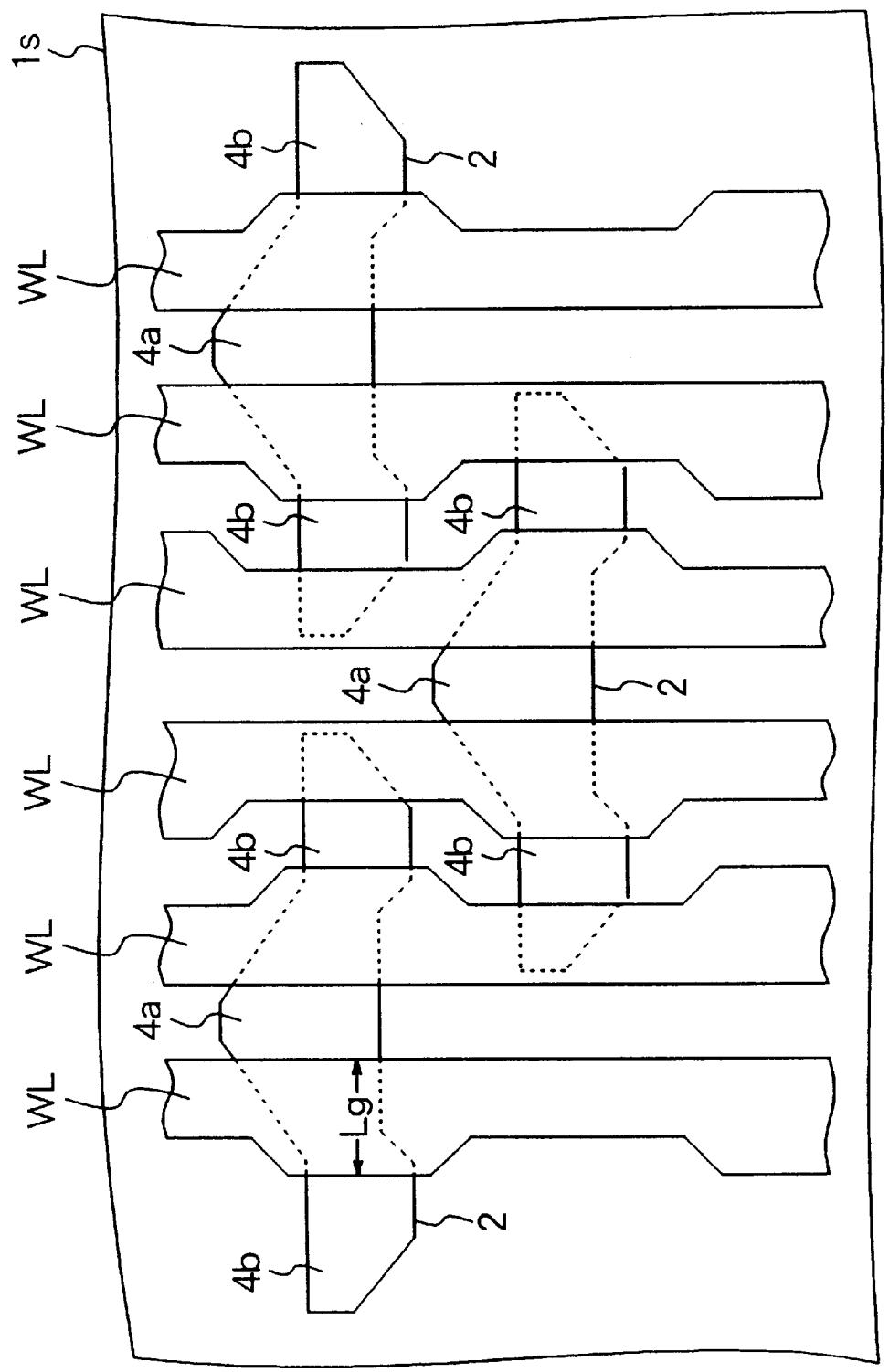
FIG. 3 is a top view of a principal portion of the memory cell region illustrated in FIG. 1.
Figure 4:
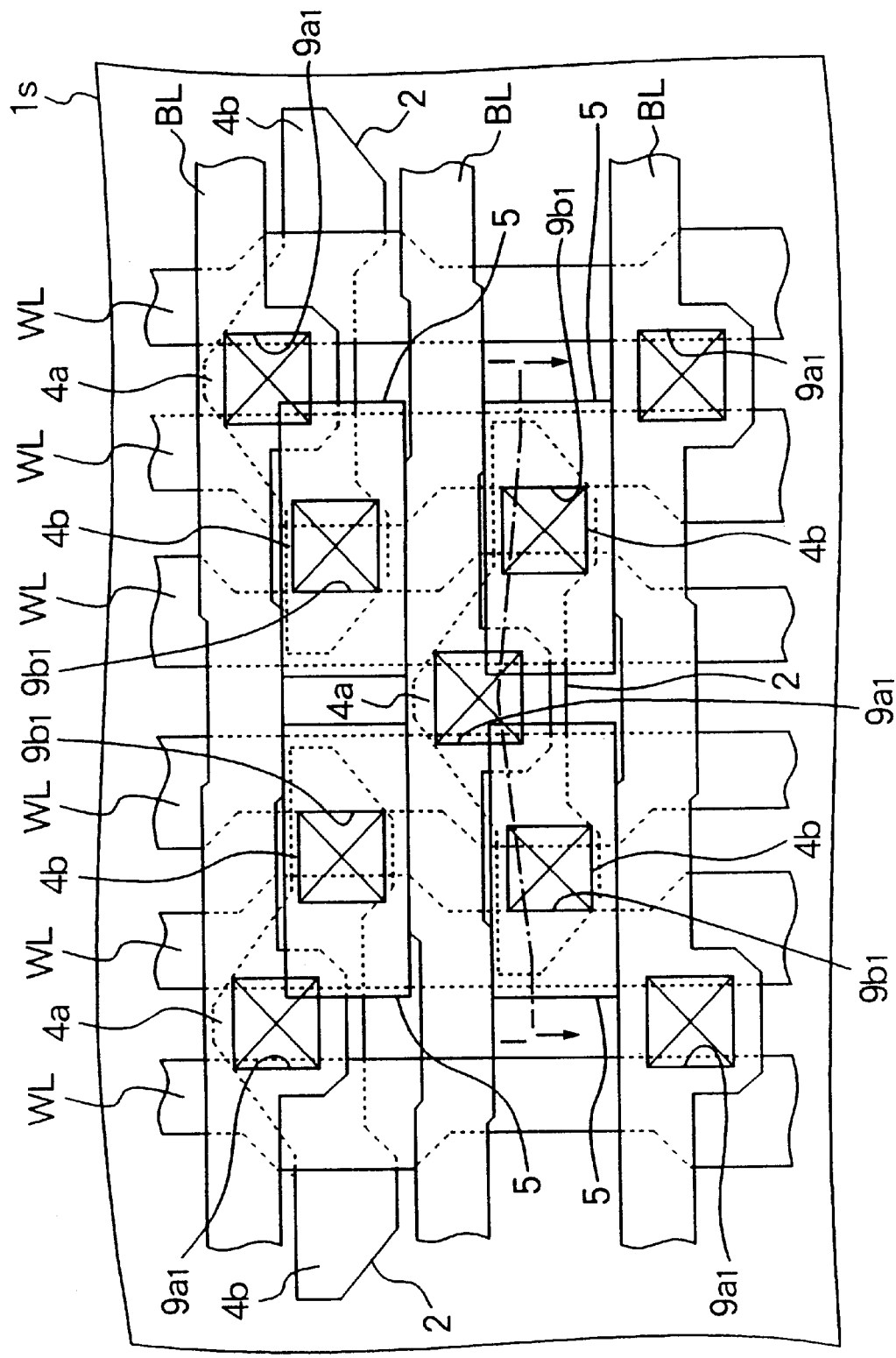
FIG. 4 is a top view of a principal portion of the memory cell region illustrated in FIG. 1.

FIG. 1 is a sectional view of a principal portion of a memory cell region included in an embodiment of a semiconductor device according to the present invention. FIG. 2 is a sectional view of a principal portion of a peripheral circuit region for the memory cell illustrated in FIG. 1. FIG. 3 is a top view of a principal portion of the memory cell region illustrated in FIG. 1. FIG. 4 is a top view of a principal portion of the memory cell region illustrated in FIG. 1. FIGS. 5a through 5z are sectional views of a semiconductor device showing an embodiment of a method for manufacturing semiconductor devices according to the present invention. FIG. 6 is a top view of a principal portion of the semiconductor device illustrated in FIG. 5g.

The semiconductor device in the present first embodiment is preferably a 64 Mbit DRAM. However, the present invention is not limited to application to 64 Mbit DRAMs, but it is applicable to various semiconductor devices.

The DRAM will now be described by referring to FIGS. 1 through 4. FIG. 1 is a sectional view taken along a line I—I illustrated in FIG. 4.

A semiconductor substrate 1s included in the DRAM is preferably made of a silicon (Si) single crystal of p-type. On the semiconductor substrate 1s, an isolating field insulating film 2 preferably made of silicon dioxide ($SiO_2$) is formed.

In a main surface of the semiconductor substrate 1s in a memory cell region M, a p-well 3p is formed. In the p-well 3p, preferably boron has been introduced as a p-type impurity. On the p-well 3p, a memory cell MC is formed. The memory cell MC includes one memory cell selection MISFET (Metal-Insulator-Semiconductor FET) or MOSFET (hereafter referred to as selection MOS) 4 and one capacitor 5. Preferably, the size of the one memory cell is approximately 1.15 $\mu m^2$.

The selection MOS 4 has one pair of semiconductor regions 4a and 4b formed on the resulting semiconductor substrate 1s so as to be spaced apart from each other, a gate insulating film 4c formed on the resulting semiconductor substrate 1s, and a gate electrode 4d formed on the gate insulating film 4c.

The semiconductor regions 4a and 4b are regions for forming a source region and a drain region of the selection MOS 4. Into the semiconductor regions 4a and 4b, an n-type impurity such as phosphorus or arsenic (As) has been doped. Between the semiconductor regions 4a and 4b, a channel region of the selection MOS 4 has been formed.

The plane shape of one active region having the semiconductor regions 4a and 4b and two channel regions is defined by the surrounding field insulating film 2. The plane shape is laterally symmetric around the semiconductor region 4a (see FIG. 3).

The gate insulating film 4c is preferably made of $SiO_2$. The gate electrode 4d is formed by forming a conductor film 4d2 preferably made of tungsten silicide (WSi$_2$) on a conductor film 4d1 preferably made of a low-resistance poly-silicon film. The resistance of the gate electrode 4d is reduced by the conductor film 4d2. The gate electrode 4d may be formed by a single substance film of low-resistance poly-silicon, or it may be formed by a predetermined metal such as tungsten.

The gate electrode 4d is also a part of a word line WL. The word lines WL extend in a direction nearly perpendicular to the direction in which the above described active region extends. Each of the word lines WL has a fixed width (Lg) needed to obtain the threshold voltage of the selection MOS 4 (see FIG. 3). Preferably, the spacing between adjacent word lines WL is approximately 0.67 μm.

The upper and side surfaces of each of the gate electrode 4d (word line WL) are covered with a cap insulating film (first cap insulating film) 7a and side walls (first side wall insulating films) 7b via insulating films 6a and 6b. The cap insulating film 7a and the side walls 7b are covered with inter-layer insulating films 8a through 8c. The insulating film 7a and the side walls are in contact with the inter-layer insulating film 8a. In the inter-layer insulating films 8a through 8c, a contact hole 9a1 is formed so as to expose the semiconductor region 4a located on the surface of the resulting semiconductor substrate 1s. In the inter-layer insulating films 8a and 8b, a contact hole (lower contact hole) 9b1 is formed so as to expose the semiconductor region 4b located on the other surface of the resulting semiconductor substrate 1s. Preferably, the diameter of the contact holes 9a1 and 9b1 is approximately 0.36 μm.

The insulating films 6a and 6b are preferably made of SiO$_2$. In the present first embodiment, the cap insulating film 7a and the side walls 7b are preferably made of silicon nitride.

In forming the cap insulating film 7a and the side walls 7b, the insulating films 6a and 6b function to prevent the inside of a film forming processor from being polluted with metal elements contained in the conductor film 4d2.

In forming the contact holes 9a1 and 9b1 in the inter-layer insulating films 8a and 8b, the cap insulating film 7a and the side walls 7b serve as etching stoppers. The cap insulating film 7a and the side walls 7b serve as films for forming bit line contact holes 9a1 and capacitor contact holes 9b1 between adjacent word lines WL in a self-aligned manner. In other words, the cap insulating film 7a and the side walls 7b define dimensions of the contact holes 9a1 and 9b1 in the width direction of the word lines WL.

Even if the contact holes 9a1 and 9b1 are deviated in the width direction of the word lines WL (lateral direction of FIG. 3), the cap insulating film 7a and the side walls 7b serve as the etching stoppers and consequently exposure of a part of the word line WL from the contact holes 9a1 and 9b1 is prevented. Therefore, alignment tolerance of the contact holes 9a1 and 9b1 can be reduced.

Even if the contact holes 9a1 and 9b1 are deviated in the length direction of the word line WL (vertical direction of FIG. 3), the thickness of the inter-layer insulating films 8a and 8b is secured to some degree and consequently the upper surface of the semiconductor substrate 1s is prevented from being exposed from the contact holes 9a1 and 9b1.

The inter-layer insulating film 8a is preferably made of SiO$_2$. The inter-layer insulating film 8b is preferably made of BPSG (Boro Phospho Silicate Glass). The inter-layer insulating film 8a functions to prevent boron or phosphorus contained in the inter-layer insulating film 8b located on the film 8a from being diffused to the resulting semiconductor substrate 1s located under the film 8a.

Furthermore, the inter-layer insulating film 8b functions to flatten the underlayer on which wiring conductors are to be formed. Thereby, the margin of the photolithography can be secured, and the pattern transcription precision of the contact holes 9a1 and 9b1 and the wiring can be improved.

On the inter-layer insulating film 8b, the inter-layer insulating film 8c preferably made of SiO$_2$ is formed. If a portion of the cap insulating film 7a is exposed from the inter-layer insulating film 8b, the exposed portion might be etched and the word line WL might be exposed in a bit line forming process which will be described later. The inter-layer insulating film 8c functions to prevent it. In the case where such a problem does not occur, therefore, the inter-layer insulating film may not be provided.

On the inter-layer insulating film 8c, a bit line BL is formed. The bit line BL is formed by forming a conductor film (second conductor film) BL2 preferably made of WSi$_2$ on a conductor film (first conductor film) BL1 preferably made of low-resistance poly-silicon. The bit line BL is electrically connected to the semiconductor region 4a via the contact hole 9a1. Preferably, the spacing between adjacent bit lines BL is approximately 0.86 μm.

Between the conductor film BL1 and the inter-layer insulating film 8c, a mask film (second mask film) 10b used as an etching mask in forming the contact hole 9a1 is left. This mask film 10b is a film for raising the etching selection ratio in forming the contact hole 9a1. The mask film 10b is preferably made of low-resistance poly-silicon. The mask film 10b is also a part of a bit line BL.

The bit line BL is disposed so as to cross the above described word line WL (preferably so as to be nearly perpendicular to the word line WL) (see FIG. 4). It is not always necessary to square the center line of the bit line BL with the center of the bit contact hole 9a1. In this case, however, the bit line BL needs a projection for completely surrounding the bit line contact hole 9a1.

If the above described projection is formed on the bit line BL, there is a possibility that a short-circuit defect between an adjacent bit line BL and the projection will occur. Therefore, a portion of the bit line BL adjacent to the projection is slightly bent so as to be separated from the projection.

The upper and side surfaces of the bit line BL are covered with a cap insulating film (second cap insulating film) 11a and side walls (second side wall insulating films) 11b via insulating film 6c and 6d. The cap insulating film 11a and the side walls 11b serve as etching stoppers in forming an extension contact hole or upper contact hole 9b2 in the inter-layer insulating film 8c, and serve as films for forming the contact hole 9b2 between adjacent bit lines BL in a self-aligning manner. In other words, the cap insulating film 11a and the side walls 11b define the dimensions of the capacitor contact holes 9b1 and 9b2 in the width direction of the bit line BL.

Even if the contact holes 9b1 and 9b2 are deviated in the width direction of the bit lines BL (vertical direction of FIG. 4), the cap insulating film ila and the side walls 11b serve as the etching stoppers and consequently the contact holes 9b1 and 9b2 are prevented from getting into the isolating region excessively. Therefore, the alignment tolerance of the contact holes 9b1 and 9b2 can be reduced.

Furthermore, the cap insulating film 11a and the side walls 11b are covered with an insulating film 12. The insulating film 12 is a film functioning as an etching stopper in removing an underlying insulating film left after the capacitor 5 has been formed. The insulating film 12 is made of silicon nitride.

The thickness of the insulating film 12 is set to a value in the range of 100 to 500 Å, preferably to approximately 250 Å. Because a thickness greater than this value causes hydrogen to be seized by the silicon nitride film in final hydrogen annealing processing for terminating a dangling bond and makes a sufficient terminating effect unobtainable.

Over the bit line BL, the capacitor 5 preferably taking the shape of a cylinder is formed. In other words, the DRAM of the present first embodiment has the COB structure. The capacitor 5 is formed by covering the surface of a first electrode (third conductor film) 5a with a second electrode 5c via a capacitor insulating film 5b. In the present first embodiment, therefore, capacitive portions are formed on the lower surface side of the first electrode 5a and the side surfaces of the shaft portion of the cylindrincal capacitor 5 as well. As a result, a large capacitance value can be secured.

The first electrode 5a is preferably made of low-resistance poly-silicon. The first electrode 5a is electrically connected to one semiconductor region 4b of the selection MOS 4 through a conductor film (first conductor film) 13 embedded in the contact hole 9b1. The conductor film 13 is preferably made of low-resistance poly-silicon.

The capacitor insulating film 5b is preferably formed by forming a $SiO_2$ film on a silicon nitride film. The second electrode 5c is preferably made of low-resistance poly-silicon, and it is electrically connected to predetermined wiring conductors.

A mask film (third mask film) 10c located under the first electrode 5a of the capacitor 5 is a film which was used as the mask when the contact hole 9b2 was opened. The mask film 10c is made of low-resistance poly-silicon, and it is a part of the first electrode 5a of the capacitor 5.

With reference to FIG. 2, the p-well 3p and an n-well 3n are formed on the semiconductor substrate 1s in a peripheral circuit region P. In the p-well 3p, preferably boron functioning as a p-type impurity has been introduced. In the n-well 3n, phosphorus or As functioning as an n-type impurity has been introduced. On the p-well 3p and the n-well 3n, preferably an nMOS 14 and a pMOS 15 are formed.

By these nMOS 14 and pMOS15, peripheral circuits of the DRAM such as a sense amplifier circuit, colomn decoder circuit, column driver circuit, row decoder circuit, row driver circuit, I/O selector circuit, data input buffer circuit, data output buffer circuit and power supply circuit are formed.

The nMOS 14 has one pair of semiconductor regions 14a and 14b formed on the p-well 3p so as to be spaced apart from each other, a gate insulating film 14c formed on the resulting semiconductor substrate 1s, and a gate electrode 14d formed on the gate insulating film 4c.

The semiconductor regions 14a and 14b are regions for forming the source region and drain region of the nMOS 14, respectively. In the semiconductor regions 14a and 14b, preferably phosphorus or As functioning as an n-type impurity has been ontroduced. Between the semiconductor regions 14a and 14b, the channel region of the nMOS 14 is formed.

The gate insulating film 14c is preferably made of $SiO_2$. The gate electrode 14d is formed preferably by forming a conductor film 14d2 made of $WSi_2$ on a conductor film 14d1 made of low-resistance poly-silicon. The gate electrode 14d may be preferably formed by a single substance film of low-resistance silicon or may be formed by metal.

On the upper and side surfaces of the gate electrode 14d, a cap insulating film 7a and side walls 7b are formed via an insulating film 6a and insulating films 6b. The insulating films 6a and 6b have the same function as the insulating films 6a and 6b of the above described memory cell region M do, and they are preferably made of $SiO_2$.

The cap insulating film 7a and the side walls 7b are preferably made of silicon nitride. In this case, however, the side wall 7b is a film for mainly forming a LDD (Lightly Doped Drain) structure.

The pMOS 15 has one pair of semiconductor regions 15a and 15b formed on the n-well 3n so as to be spaced apart from each other, a gate insulating film 15c formed on the resulting semiconductor substrate 1s, and a gate electrode 15d formed on the gate insulating film 15c.

The semiconductor regions 15a and 15b are regions for forming the source region and drain region of the pMOS 15, respectively. In the semiconductor regions 15a and 15b, preferably phosphorus functioning as a p-type impurity has been introduced. Between the semiconductor regions 15a and 15b, the channel region of the PMOS 15 is formed.

The gate insulating film 15c is preferably made of $SiO_2$. The gate electrode 15d is formed preferably by forming a conductor film 15d2 made of $WSi_2$ on a conductor film 15d1 made of low-resistance poly-silicon. The gate electrode 15d may be formed by a single substance film or may be formed by metal.

On the upper and side surfaces of the gate electrode 15d, a cap insulating film 7a and side walls 7b are formed via an insulating film 6a and insulating films 6b. The insulating films 6a and 6b have the same function as the insulating films 6a and 6b of the above described memory cell region M do, and they are preferably made of $SiO_2$.

The cap insulating film 7a and the side walls 7b are preferably made of silicon nitride. In this case, however, the side wall 7b is a film for mainly forming the LDD structure.

The nMOS 14 and the pMOS 15 are covered with the above described inter-layer insulating films 8a through 8c. On the inter-layer insulating film 8c, the above described insulating film 12 is formed. In the memory cell region M and the peripheral circuit region P, an inter-layer insulating film 8d is formed on the insulating film 12. The second electrode 5c of the capacitor 5 is covered with the inter-layer insulating film 8d.

The inter-layer insulating film 8d is formed by forming an insulating film 8d2 preferably made of BPSG on an insulating film 8d1 preferably made of $SiO_2$. The insulating film 8d1 functions to prevent boron or phosphorus contained in the inter-layer insulating film 8d2 located on the film 8d1 from being diffused toward the second electrode 5c of the capacitor 5.

A method for manufacturing the semiconductor device of the present first embodiment will now be described by referring to FIGS. 5a through 5z and FIG. 6.

As shown in FIG. 5a, the surface of the semiconductor substrate 1s made of a p-type Si single crystal is subjected to thermal oxidation processing. An insulating film 16 preferably having a thickness of approximately 135 Å made of $SiO_2$ is thus formed. On the upper surface of the insulating film 16, an insulating film 17 preferably having a thickness of approximately 1400 Å made of silicon nitride is then formed by means of a CVD method.

Subsequently, patterning is conducted by removing a portion of the insulating film 17 located in the isolation region by means of the photolithography technique and dry etching technique. Thereafter, selective oxidation processing is conducted by using the patterned insulating film 17 as a mask. Thereby, an isolating field insulating film 2 is formed on the main surface of the semiconductor substrate 1s as shown in FIG. 5b. The field insulating film 2 is preferably made of $SiO_2$ and has a film thickness of approximately 4000 Å.

Thereafter, the insulating film 17 is removed by hot phosphoric acid solution. By using a photoresist as a mask, preferably boron functioning as a p-type impurity is then doped to a predetermined position of the semiconductor substrate 1s by ion implantation. After the photoresist has been removed, the semiconductor substrate 1s is subjected to thermal diffusion processing and consequently the p-well 3p is formed as shown in FIG. 5c.

By using a photoresist as a mask, preferably phosphorus functioning as an n-type impurity is doped to a predetermined position of the semiconductor substrate 1s by ion implantation. After the photoresist has been removed, the semiconductor substrate 1s is subjected to thermal diffusion processing and consequently the n-well 3n is formed as shown in FIG. 5c.

Subsequently, the insulating film 16 located on the surface of the semiconductor substrate 1s is etched and removed by fluoric acid solution. Thereafter, on the surface of the semiconductor substrate 1s, an insulating film (not illustrated) preferably having a thickness of approximately 100 Å made of $SiO_2$ is formed.

In order to optimize the impurity concentration in the channel region and obtain the threshold voltage of each MOS, predetermined impurity ions are implanted on the main surface of the active region.

As shown in FIG. 5c, the insulating film located on the surface of the resulting semiconductor substrate 1s is etched and removed by means of fluoric acid solution. On the surface of the resulting semiconductor substrate 1s, the gate insulating film 4c of the selection MOS and the gate insulating films 14c and 15c of the MOS forming the peripheral circuit are formed. The gate insulating film 4c is formed by using the thermal oxidation method. The film thickness of the gate insulating film 4c is approximately 90 Å.

Subsequently, on the upper surface of the resulting semiconductor substrate 1s, a conductor film 18d1 preferably made of low-resistance poly-silicon with phosphorus doped therein and a conductor film 18d2 made of $WSi_2$ are formed in order as shown in FIG. 5d. The conductor films 18d1 and 18d2 are formed preferably by using the CVD method. The conductor films 18d1 and 18d2 are preferably 700 Å and 1500 Å in thickness, respectively.

On the upper conductor film 18d2, the insulating film 6a preferably made of $SiO_2$ and the insulating film 7a made of silicon nitride are then formed in order. The insulating film 6a and the cap insulating film 7a are formed preferably by using the CVD method.

In forming the cap insulating film 7a, the insulating film 6a functions to prevent the inside of the film forming apparatus from polluted with the metal contained in the conductor film 18d2. The thickness of the insulating film 6a is preferably in the range of approximately 100 to 500 Å.

The cap insulating film 7a functions as an etching stopper in a contact hole forming process which will be described later. Preferably, the cap insulating film has a thickness of approximately 2000 Å.

Figure 5E:
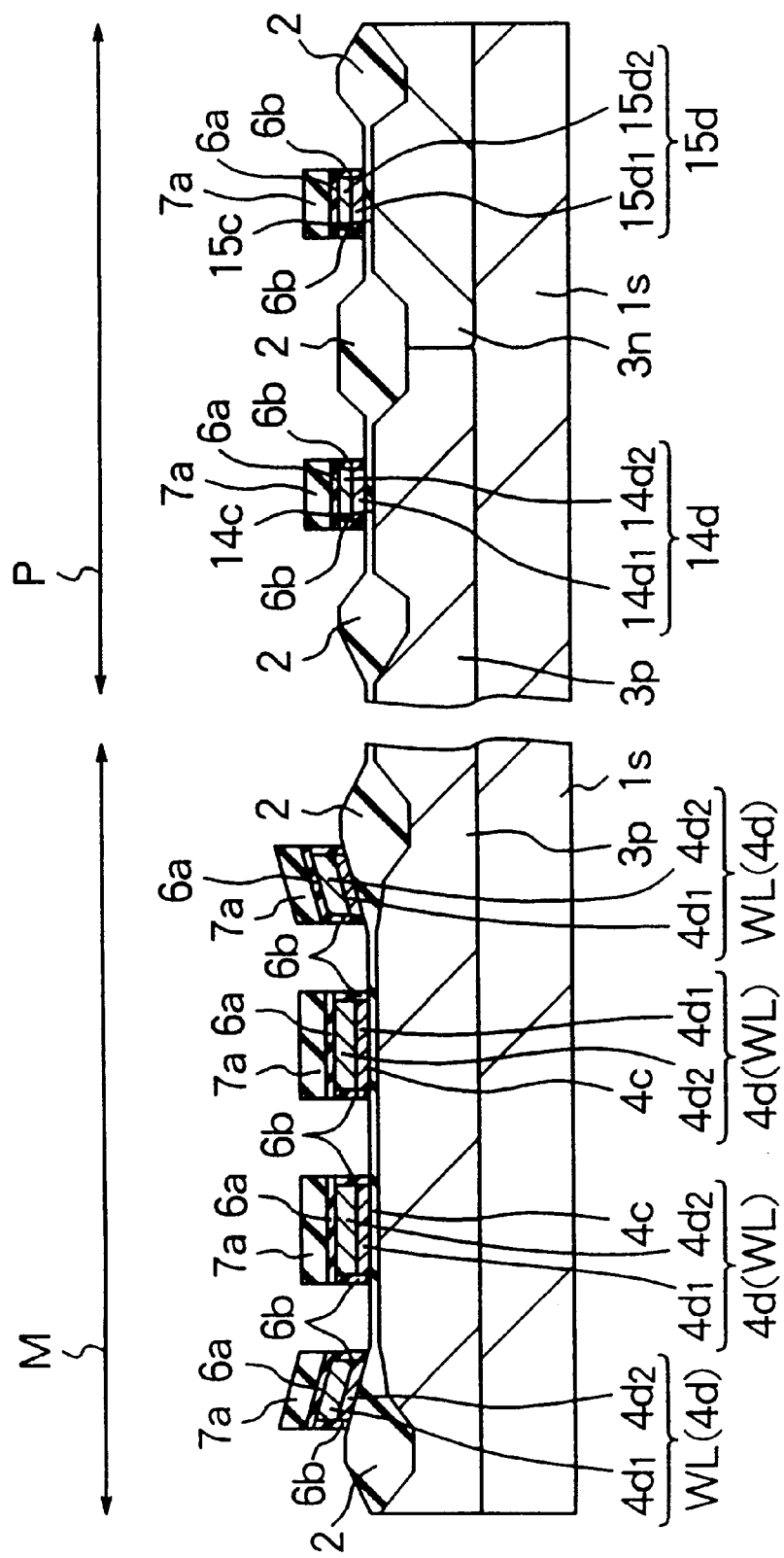
Figure 6:
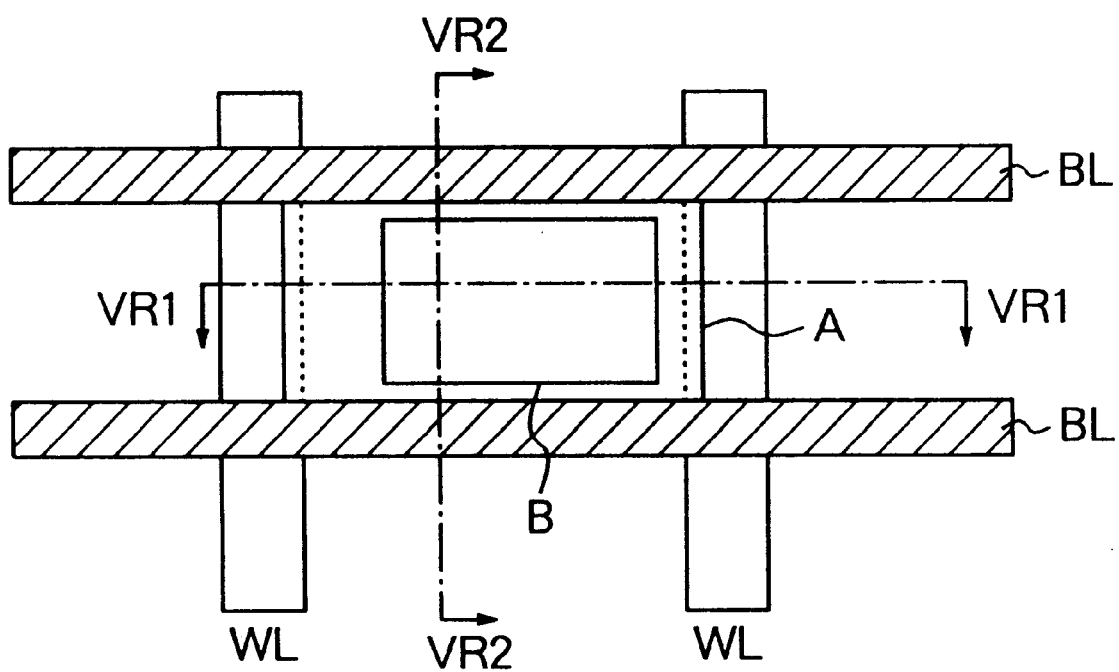
FIG. 6 is a top view of a principal portion of the device in the stage illustrated in FIG. 5g.

Subsequently, by using a photoresist as a mask, the cap insulating film 7a, the insulating film 6a, and the conductor films 18d1 and 18d2 exposed from the photoresist are etched and removed in order as shown in FIG. 5e. Thereby, the gate electrodes 4d (word line WL), 14d and 15d are formed in the memory cell region M and the peripheral circuit region P.

Subsequently, the above described photoresist is removed. Thereafter, the resulting semiconductor substrate 1s is subjected to thermal oxidation processing.

Thereby, the thin insulating film 6b preferably made of $SiO_2$ is formed on side surfaces of the gate electrodes 4d, 14d and 15d.

Figure 5F:
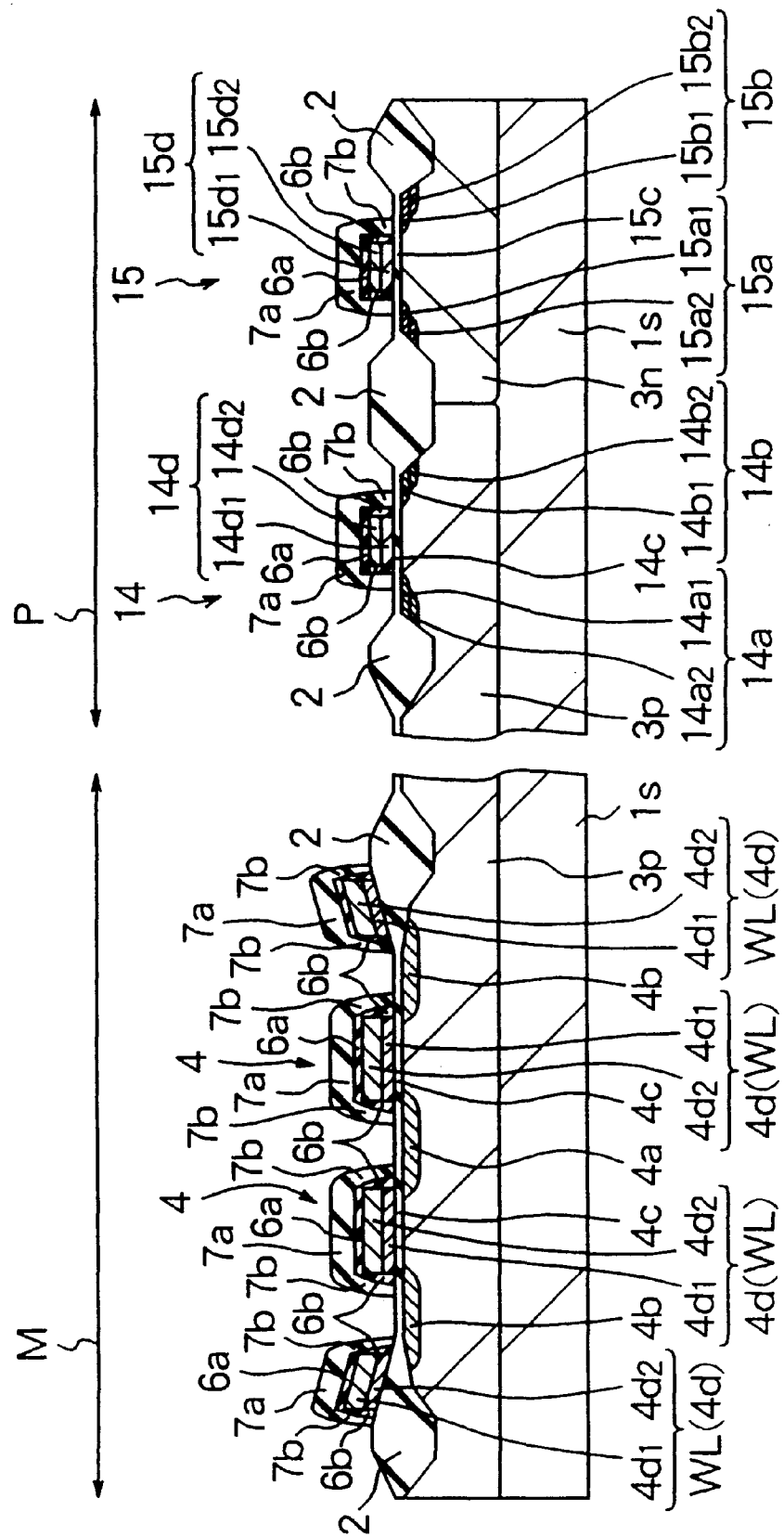

By using the gate electrodes 14d and 15d as masks, phosphorus ions functioning as an n-type impurity and boron ions functioning as a p-type impurity are then implanted respectively in the nMOS forming region and the pMOS forming region of the peripheral circuit region as shown in FIG. 5f. Thereby, semiconductor regions 14a1, 14b1, 15a1 and 15b1 having low impurity concentration values are formed.

Subsequently, phosphorus ions functioning as an n-type impurity are implanted in the selection MOS forming region of the memory cell region M. The n-type impurity are subjected to diffusion. Thereby, the semiconductor regions 4a and 4b forming the sorce region and the drain region of the selection MOS 4 are formed. To the semiconductor regions 4a and 4b, a bit line and a capacitor are later connected, respectively.

Subsequently, an insulating film preferably made of silicon nitride is formed on the resulting semiconductor substrate 1s by using the CVD method. Thereafter, the insulating film is etched back by using an anisotropic dry etching method such as reactive ion etching (RIE). Thereby, the side walls 7b are formed on the side surfaces of the gate electrodes 4d, 14d and 15d.

The source region and the drain region of the selection MOS 4 may be formed in a LDD (Lightly Doped Drain) structure by forming such side walls 7b and then implanting arsenic (As) ions in the main surface of the p-well 3p with a concentration higher than the above described phosphorus functioning as an n-type impurity.

By using the gate electrodes 14d and 15d covered with the cap insulating film 7a and the side walls 7b as a mask, phosphorus ions functioning as an n-type impurity and boron ions functioning as a p-type impurity are then implanted respectively in the nMOS forming region and the pMOS forming region of the peripheral circuit region P. Thereby, semiconductor regions 14a2, 14b2, 15a2 and 15b2 having high impurity concentration values are formed. As a result, the semiconductor regions 14a, 14b, 15a and 15b of the nMOS 14 and pMOS 15 in the peripheral circuit region P are formed.

Figure 5G:
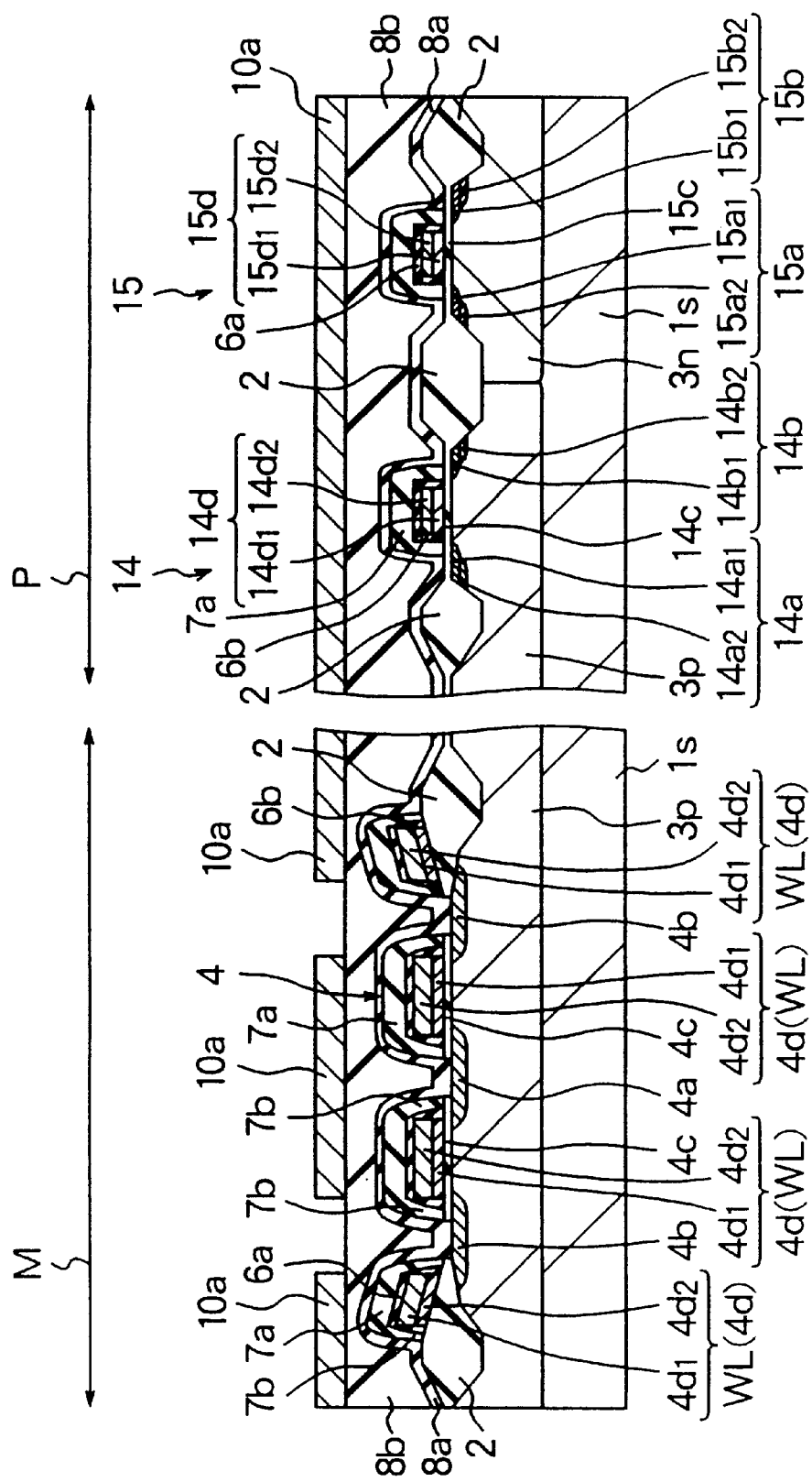

Subsequently, on the resulting semiconductor substrate 1s, the inter-layer insulating film 8a preferably made of $SiO_2$ is formed by using the CVD method as shown in FIG. 5g. Thereafter, on the inter-layer insulating film 8a, the inter-layer insulating film 8b preferably made of BPSG is formed by using the CVD method. As a result, at least the cap insulating film 7a and the side walls 7b each made of a nitride film and located on the gate electrode 4d are in contact with the insulating film 8a made of an oxide film and are covered therewith.

Subsequently, the upper surface of the inter-layer insulating film 8b is flattened by using the CMP (Chemical Mechanical Polishing) method. Thereafter, on the inter-layer insulating film 8b, a mask film (first mask film) 10a preferably made of low-resistance poly-silicon with phosphorus doped therein is formed by using the CVD method.

Thereafter, by using a photoresist as a mask, the mask film 10a is patterned by using the dry etching method. Thereby, such a pattern of the mask film 10a that the upper surface of the one semiconductor region 4b of the selection MOS 4 has an opening is formed.

In the present first embodiment, the upper surface of the inter-layer insulating film 8b underlying the mask film 10a is flattened. Therefore, a sufficient photolithography margin can be secured, and favorable pattern transcription onto the film 8b is possible. In the peripheral circuit region P, the entire upper surface of the inter-layer insulating film 8b is covered with the mask layer 10a.

The reason why low-resistance poly-silicon is used as the mask film 10a will hereafter be described. First, the etching selection ratio with respect to the silicon oxide films 8a and 8b, through which contact holes for the capacitor 5 are opened as described below, can be increased. Secondly, since the material embedded in the contact hole is low-resistance poly-silicon, the mask film 10a which is the lower layer can be simultaneously removed in etch-back processing of the low-resistance poly-silicon conductor film formed at the time of embedding the material.

However, the constituent material of the mask film 10a is not limited to poly-silicon, but can be changed diversely. For example, the constituent material may be silicon nitride.

By using the mask film 10a as an etching mask, the inter-layer insulating films 8a and 8b exposed from the mask film 10a are then removed preferably by using the dry etching method. Thereby, the contact hole (lower contact hole for capacitor) 9b1 is formed so as to expose the semiconductor region 4b of the selection MOS 4 as shown in FIG. 5h. Preferably, the contact hole 9b1 has a diameter of approximately 0.36 μm.

In the present first embodiment, the cap insulating film 7a and the side walls 7b brought into contact with and covered with the insulating films 8a and 8b, through which the contact hole 9b1 is formed, are formed by silicn nitride. Therefore, the selection ratio of the insulating films 8a and 8b with respect to silicon nitride in dry etching processing is high. As a result, the cap insulating film 7a and the side walls 7b function as etching stoppers. Accordingly, the minute contact hole 9b1 can be formed in a self-aligned manner with a high aligning precision.

Even if the position of the opening of the mask film 10a, for example, is somewhat deviated in the width direction (lateral direction in FIG. 5h) of the word line WL, the cap insulating film 7a and the side walls 7b are made of silicon nitride and function as etching stoppers and consequently a part of the word line WL is not exposed from the contact hole formed by using the mask film as an etching mask.

Furthermore, even if the position of the opening of the mask film 10a is deviated in a direction of extension of the word line WL, the underlying field insulating film 2 has a sufficiently large thickness and consequently the contact hole formed by using the mask film as an etching mask does not reach the upper part of the resulting semiconductor substrate 1s.

In the present first embodiment, therefore, the alignment margin of the contact hole 9b1 set equal to a larger value by considering the mis-alignment can be reduced. Therefore, the area of the memory cell region M can be reduced.

The dry etching conditions at this time will now be exemplified. The selection ratio between the inter-layer insulating films 8a and 8b and the cap insulating film 7a and the side walls 7b is preferably in the range of approximately 10 to 15. The reaction gas is preferably $C_4F_8/CF_4/CO/Ar$ gas preferably with approximately 3/5/200/550 sccm, respectively. Preferably, the pressure is approximately 100 mTorr.

Preferably, the RF power is approximately 1000 watts. Preferably, the processing temperature in an etching apparatus is approximately 20/60/–10° C. on the upper electrode/wall surface/lower electrode, respectively.

Figure 5J:
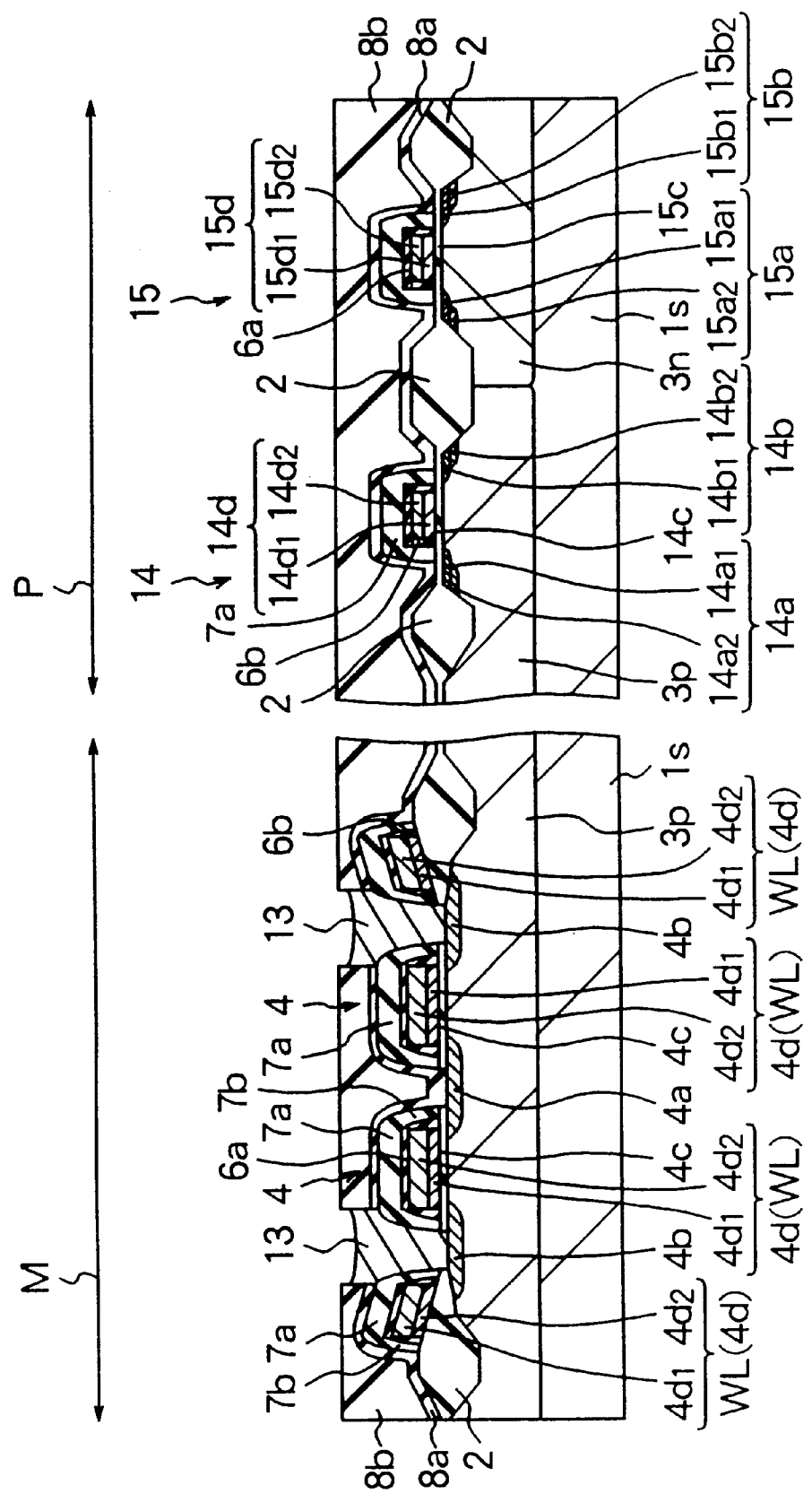

Subsequently, on the resulting semiconductor substrate 1s, the conductor film 13 made of low-resistance poly-silicon with phosphorus doped therein is formed by using the CVD method as shown in FIG. 5i. Thereafter, the conductor film 13 is etched back by using the dry etching method. Thereby, the conductor film 13 is embedded in only the contact hole 9b1 as shown in FIG. 5j. At the time of this etch-back processing, the mask film 10a of the lower layer (see FIG. 5i) is also removed.

Figure 5K:
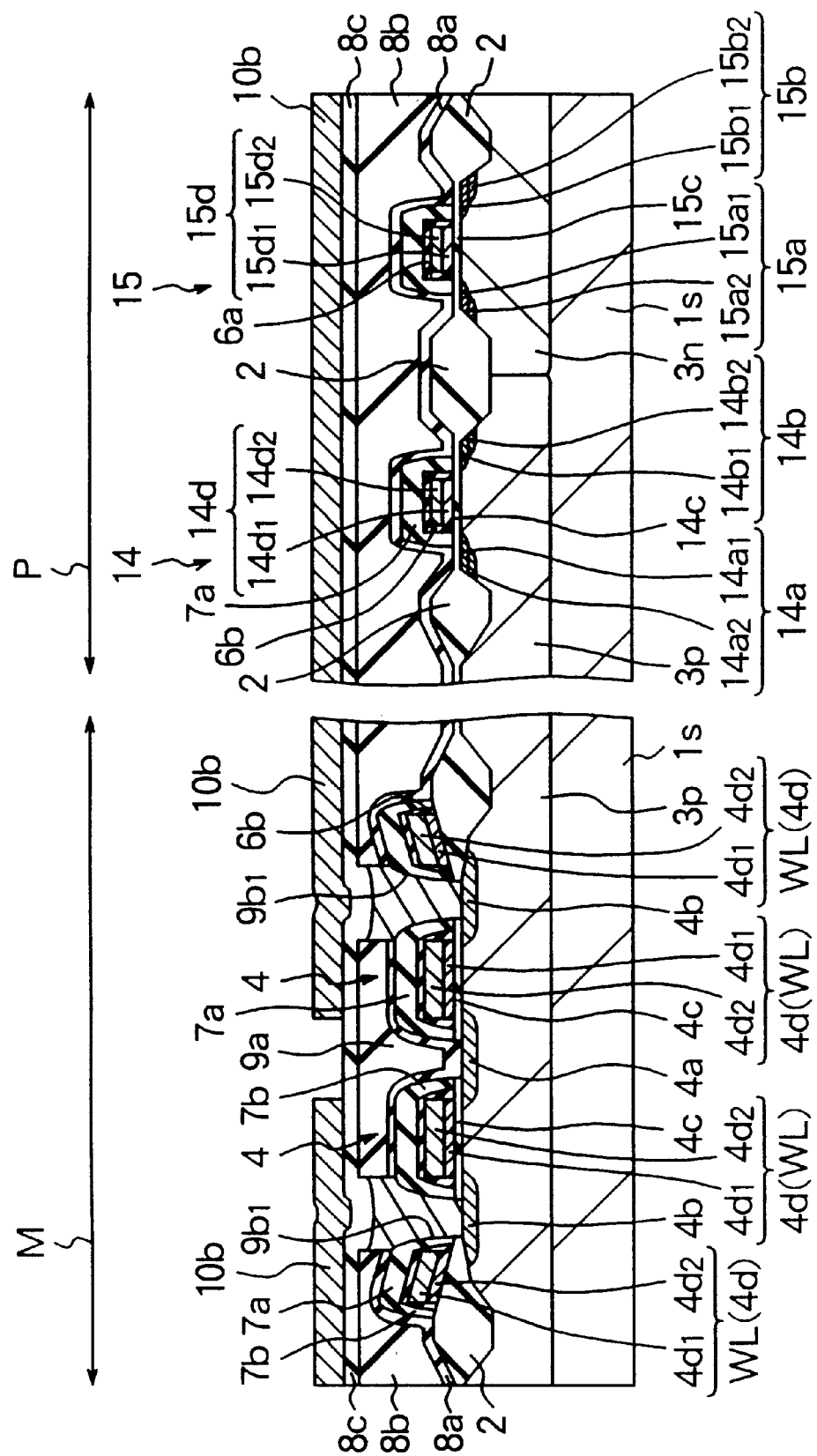
Figure 51:
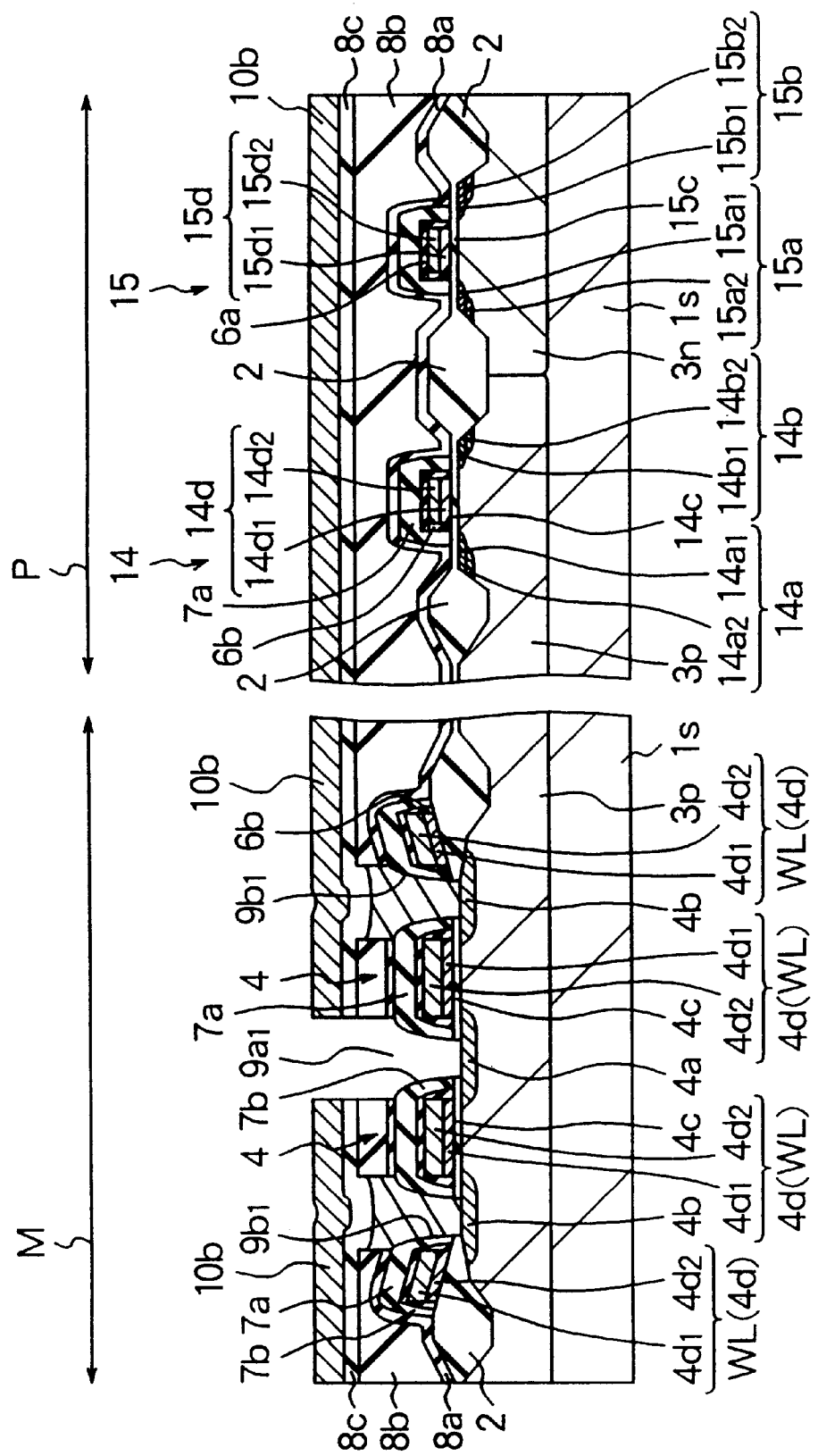

Thereafter, on the conductor film 13 and the insulating film 8b, the insulating film 8c preferably made of $SiO_2$ is formed by using the CVD method as shown in FIG. 5k. The inter-layer insulating film 8c has a thickness preferably in the range of approximately 500 to 1000 Å.

Subsequently, on the inter-layer insulating film 8c, the mask film 10b preferably made of low-resistance poly-silicon is formed by using the CVD method. The thickness of the mask film 10b is preferably in the range of 3000 to 6000 Å.

Subsequently, by using a photoresist as a mask, the mask film 10b is subjected to patterning using dry etching processing. Over the semiconductor region 4a, an opening is thus formed in the mask film 10b. Thereafter, the inter-layer insulating films 8a through 8c in the region exposed from the opening are etched and removed by using dry etching processing.

Thereby, the contact hole (bit line contact hole) 9a1 is formed so as to expose the semiconductor region 4a of the selection MOS 4 as shown in FIG. 5l. Preferably, the contact hole 9a1 has a diameter of approximately 0.36 μm.

In the present first embodiment, the cap insulating film 7a and the side walls 7b brought into contact with and covered with the insulating films 8a and 8b, through which the contact hole 9a1 is formed, are formed by silicn nitride. Therefore, the selection ratio of the insulating films 8a and 8b with respect to silicon nitride in dry etching process is high. As a result, the cap insulating film 7a and the side walls 7b function as etching stoppers. Accordingly, the minute contact hole 9a1 can be formed in a self-aligned manner with a high aligning precision.

Even if the position of the opening of the mask film 10b, for example, is somewhat deviated in the width direction (lateral direction in FIG. 5l) of the word line WL, the cap insulating film 7a and the side walls 7b are made of silicon nitride and function as etching stoppers and consequently a part of the word line WL is not exposed from the contact hole formed by using the mask film as an etching mask.

Furthermore, even if the position of the opening of the mask film 10a is deviated in a direction of extension of the word line WL, the underlying field insulating film 2 has a sufficiently large thickness and consequently the contact hole formed by using the mask film as an etching mask does not reach the upper part of the resulting semiconductor substrate 1s.

In the present first embodiment, therefore, the alignment margin of the contact hole 9a1 set equal to larger value by considering the mis-alignment can be reduced. Therefore, the area of the memory cell region M can be reduced.

The dry etching conditions at this time will now be exemplified. The selection ratio between the inter-layer insulating films 8a and 8b and the cap insulating film 7a and the side walls 7b is preferably in the range of approximately 10 to 15. The reaction gas is preferably $C_4F_8/CF_4/CO/Ar$ gas preferably with approximately 3/5/200/550 sccm, respectively. Preferably, the pressure is approximately 100 mTorr. Preferably, the RF power is approximately 1000 watts. Preferably, the processing temperature in an etching apparatus is approximately 20/60/–10° C. on the upper electrode/wall surface/lower electrode, respectively.

Figure 5M:
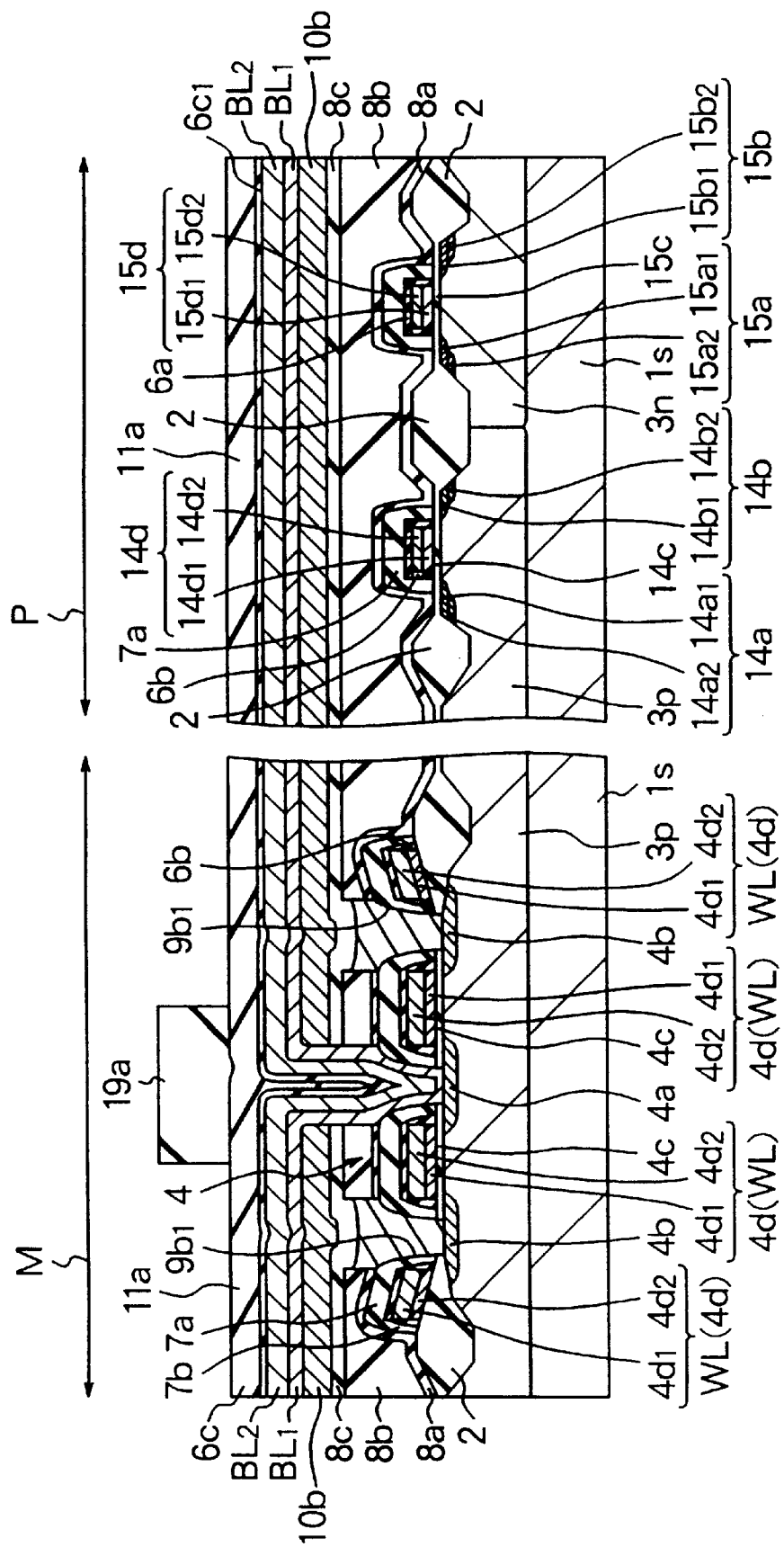

Subsequently, on the resulting semiconductor substrate 1s including the semiconductor region 4a exposed to the contact hole 9a1, the conductor film BL1 made of low-resistance poly-silicon with phosphorus doped therein and the conductor film BL2 made of $WSi_2$ are formed in order by using the CVD method as shown in FIG. 5m. Subsequently, on the conductor film BL2, the insulating film 6c made of $SiO_2$ and the cap insulating film 11a made of silicon nitride are formed in order by using the CVD method. Preferably, the cap insulating film 11a has a thickness of approximately 2000 Å.

Subsequently, on the cap insulating film hla, a photoresist 19a is formed so as to cover the bit line forming region. By using the photoresist 19a as an etching mask, the cap insulating film 11a, the insulating film 6c, the conductor films BL2 and BL1, and the mask film 10b exposed from the mask are then etched and removed in order.

Figure 5N:
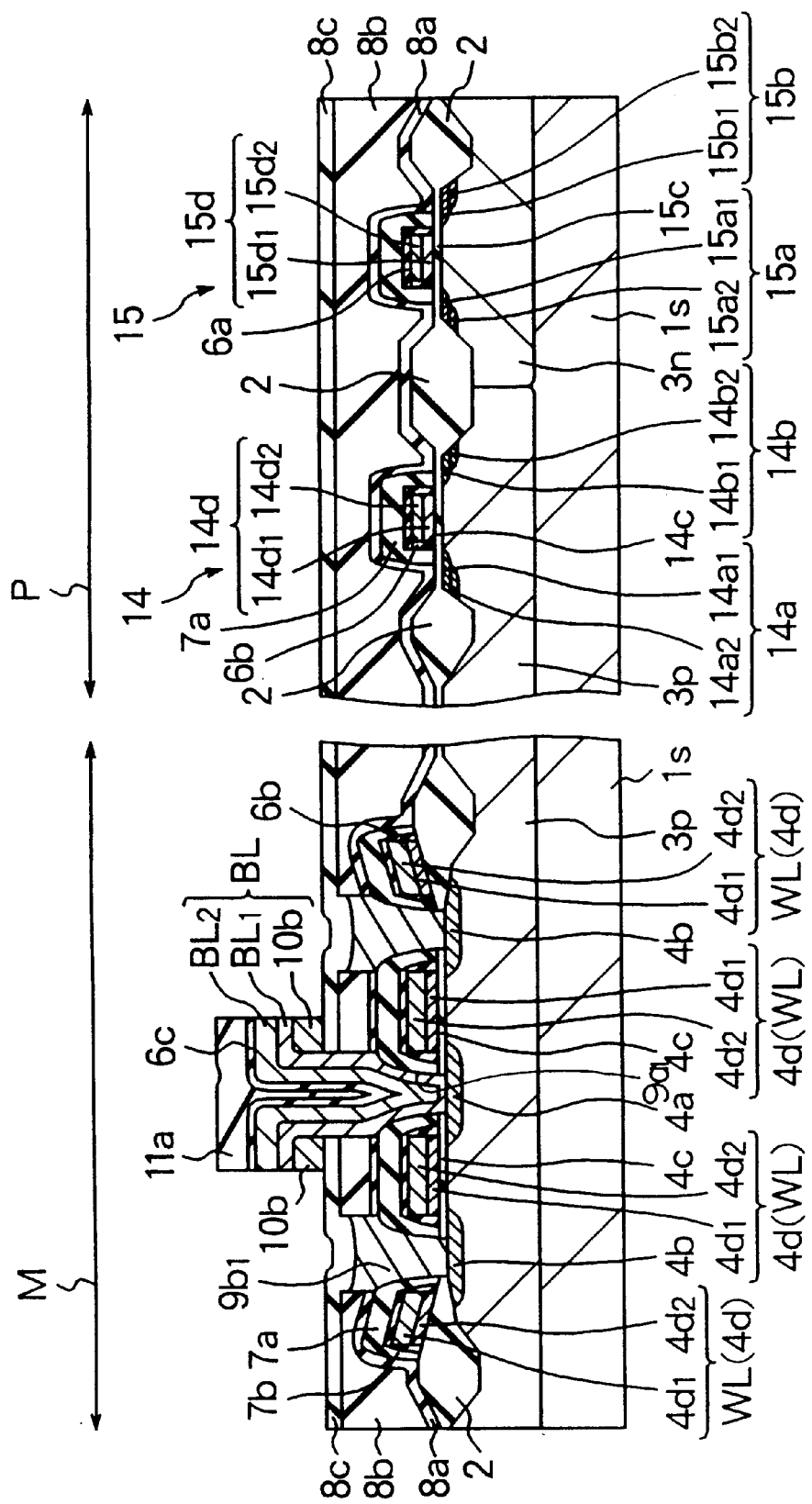
Figure 50:
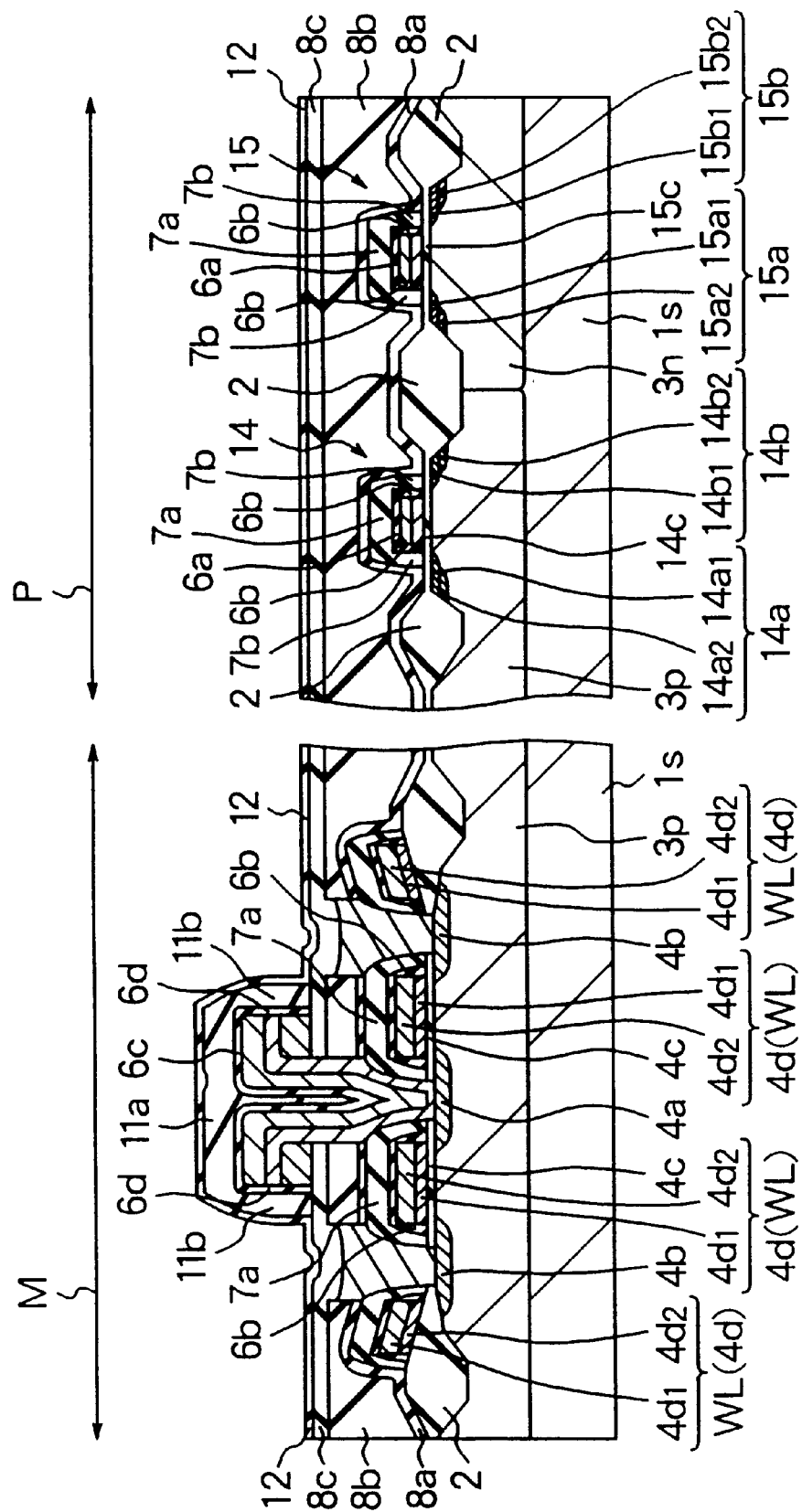

Thereby, the bit line BL including the conductor films BL1 and BL2 and the mask film 10b is formed as shown in FIG. 5n. The bit line BL is electrically connected to one semiconductor region 4a of the selection MOS 4 through the contact hole 9a1.

Subsequently, the photoresist 19a (see FIG. 5m) is removed. Thereafter, the resulting semiconductor substrate 1 is subjected to thermal oxidation processing. Thereby, the thin insulating film 6d preferably made of $SiO_2$ is formed on the side surfaces of the conductor films BL1 and BL2 and the mask film 10b included in the bit line BL as shown in FIG. 5o.

Thereafter, on the resulting semiconductor substrate 1s, an insulating film preferably made of silicon nitride is formed by using the CVD method. Thereafter, the insulating film is etched and removed by using an anisotropic dry etching method such as the RIE. As a result, the side walls 11b are formed on the side surfaces of the bit line BL.

Subsequently, on the resulting semiconductor substrate 1s, the insulating film 12 made of silicon nitride preferably having a thickness in the range of approximately 100 to 500 Å, more preferably having a thickness of approximately 250 Å is formed by using the CVD method. The insulating film 12 functions as an etching stopper in a wet etching removal process of the underlying insulating subsequent to the capacitor forming processing which will be described later.

Subsequently, on the insulating film 12, an insulating film 20 preferably made of $SiO_2$ is formed by using the CVD method so as to contact the film 12 with the film 20 and cover the film 12 with the film 20 as shown in FIG. 5p. Thereafter, the upper surface of the insulating film 20 is flattened preferably by the CMP method.

Thereafter, on the resulting semiconductor substrate 1s, a mask film 10c preferably made of low-resistance polysilicon with phosphorus doped therein is formed by using the CVD method. In this case, the mask film 10c has a thickness in the range of approximately 500 to 2000 Å.

Figure 5Q:
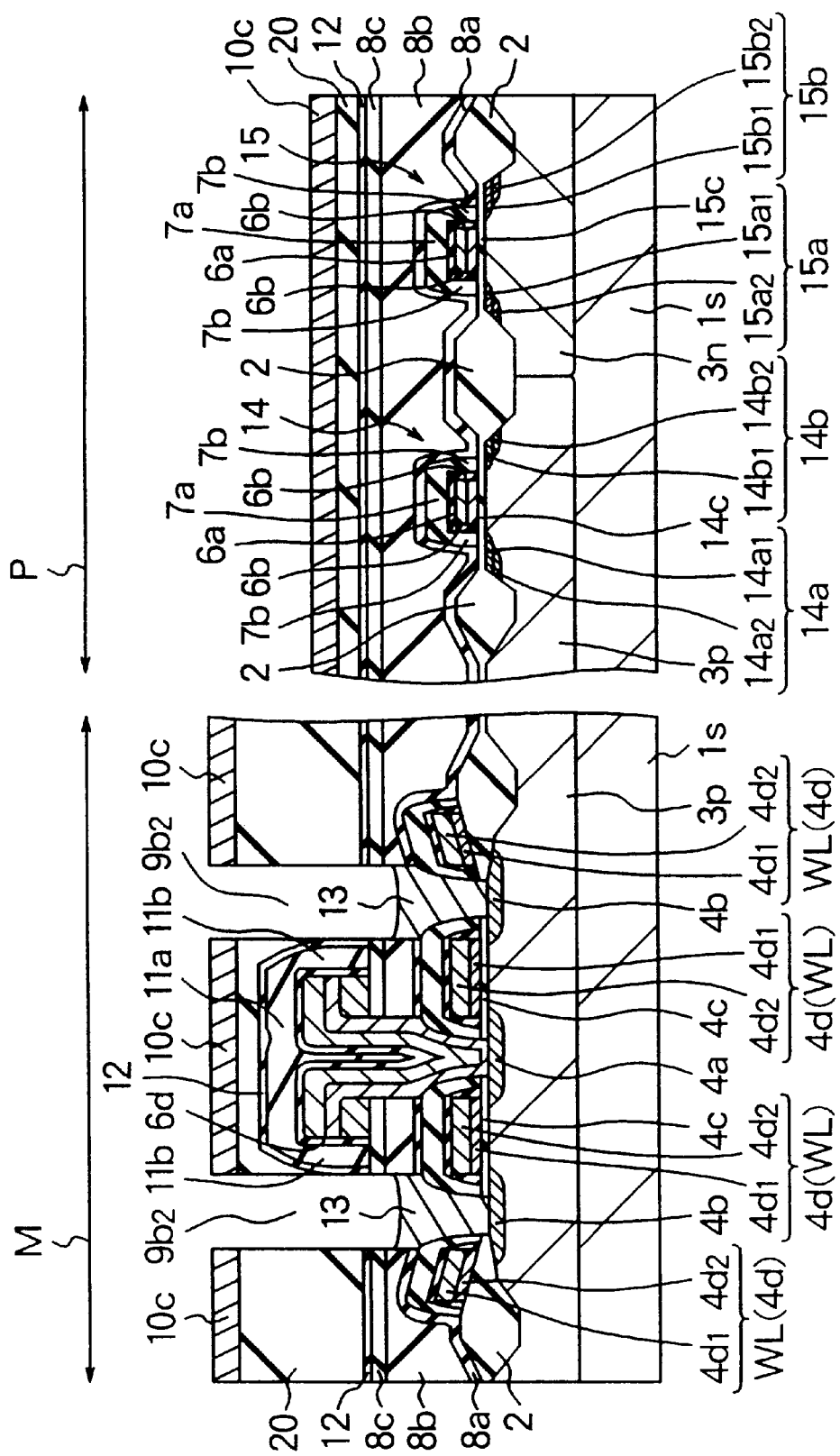

Subsequently, in the mask film 10c, an opening is formed in the capacitor contact hole forming region by using the photolithography technique and the dry etching technique. By using the mask film 10c as an etching mask, the insulating film 20, the insulating film 12 and the inter-layer insulating film 8c in the region exposed from the mask film 10c are then etched and removed. Thereby, the contact hole (upper contact hole or extension contact hole) 9b2 is formed so as to reach the conductor film 13 as shown in FIG. 5q. Preferably, the contact hole 9b2 has a diameter of approximately 0.36 μm.

In the present embodiment, the cap insulating film 11a and the side walls 11b covered with the insulating films 20 and 12 and covering the bit line BL, through which the contact hole 9b2 is formed, are formed by silicon nitride. Therefore, the selection ratio of the insulating film 20 with respect to silicon nitride in dry etching processing is high. As a result, the cap insulating film 11a and the side walls 11b function as etching stoppers. Accordingly, the minute contact hole (second capacitor contact hole) 9b2 can be formed in a self-aligning manner with a high aligning precision.

A simplified top view of a principle part of the memory cell region M at this stage is shown in FIG. 6. Sectional views thereof taken along lines VR1—VR1 and VR2—VR2 are shown in FIGS. 5r1 and 5r2, respectively.

Even if the position of the opening of the mask film 10c (see FIG. 5q), for example, is somewhat deviated in the width direction (vertical direction in FIG. 6) of the bit line BL, the cap insulating film 11a and the side walls 11b are made of silicon nitride and function as etching stoppers as can be understood from FIG. 5r2 and consequently a part of the bit line BL is not exposed from the contact hole formed by using the mask film as an etching mask.

Furthermore, even if the position of the opening of the mask film 10c (see FIG. 5q) is deviated in the direction of extension (lateral direction in FIG. 6) of the bit line BL, the cap insulating film 7a and the side walls 7b covering the underlying word line WL are made of silicon nitride and function as etching stoppers as understood from FIG. 5r1 and consequently a part of the word line WL is not exposed from the contact hole formed by using the mask film as an etching mask.

In other words, the capacitor contact holes 9b1 and 9b2 are formed so as to be positioned within the range of a region A surrounded by the word lines WL and the bit lines BL in the present first embodiment as shown in FIG. 6. The region B of FIG. 6 indicates the forming range of the contact holes 9b1 and 9b2 with due regard to another alignment tolerance such as the alignment tolerance range considering the alignment with respect to the isolation region.

The dry etching conditions at this time will now be exemplified. The selection ratio between the insulating films 20 and the cap insulating film 11a and the side walls 11b is preferably in the range of approximately 10 to 15. The reaction gas is preferably $C_4F_8/CF_4/CO/Ar$ gas preferably with approximately 3/5/200/550 sccm, respectively. Preferably, the pressure is approximately 100 mTorr. Preferably, the RF power is approximately 1000 watts. Preferably, the processing temperature in an etching apparatus is approximately 20/60/–10° C. on the upper electrode/wall surface/lower electrode, respectively.

Subsequently, on the mask layer 10c, the conductor film 5a having a thickness in the range of approximately 500 to 1000 Å preferably made of low-resistance poly-silicon with phosphorus doped therein is formed. On the upper surface of the conductor film 5a, an insulating film 21 having a thickness in the range of approximately 3000 to 6000 Å preferably made of $SiO_2$ is then formed by using the plasma CVD method.

The conductor film 5a is formed in the contact holes 9b1 and 9b2 as well and electricallly connected to the other semiconductor region 4b of the selection MOS 4 through the conductor film 13.

The insulating film 21 is made of an insulating film having a higher etch rate in wet etching processing than that of the underlying insulating film 20 made of the BPSG. The reason will now be described. It is now assumed that the etching rate of the insulating film 21 is lower than that of the insulating film 20. The insulating film 21 is embedded also in a narrow hollow located at the center of the first electrode 5a. In simultaneously removing the insulating film 21 and the insulating film 20 in a subsequent process, therefore, the insulating film 20 is removed before the insulating film 21 is sufficiently removed. If the etching rate of the insulating film 21 is lower than that of the insulating film 20, therefore, a bad influence is exerted upon underlying devices in some cases.

Subsequently, in the insulating film 21, the conductor film 5a and the mask layer 10c, portions exposed from the photoresist are etched and removed by using the dry etching method. Thereby, a lower portion 5a1 of the first electrode 5a of the capacitor and the insulating film 21 are formed as shown in FIG. 5s.

Figure 5T:
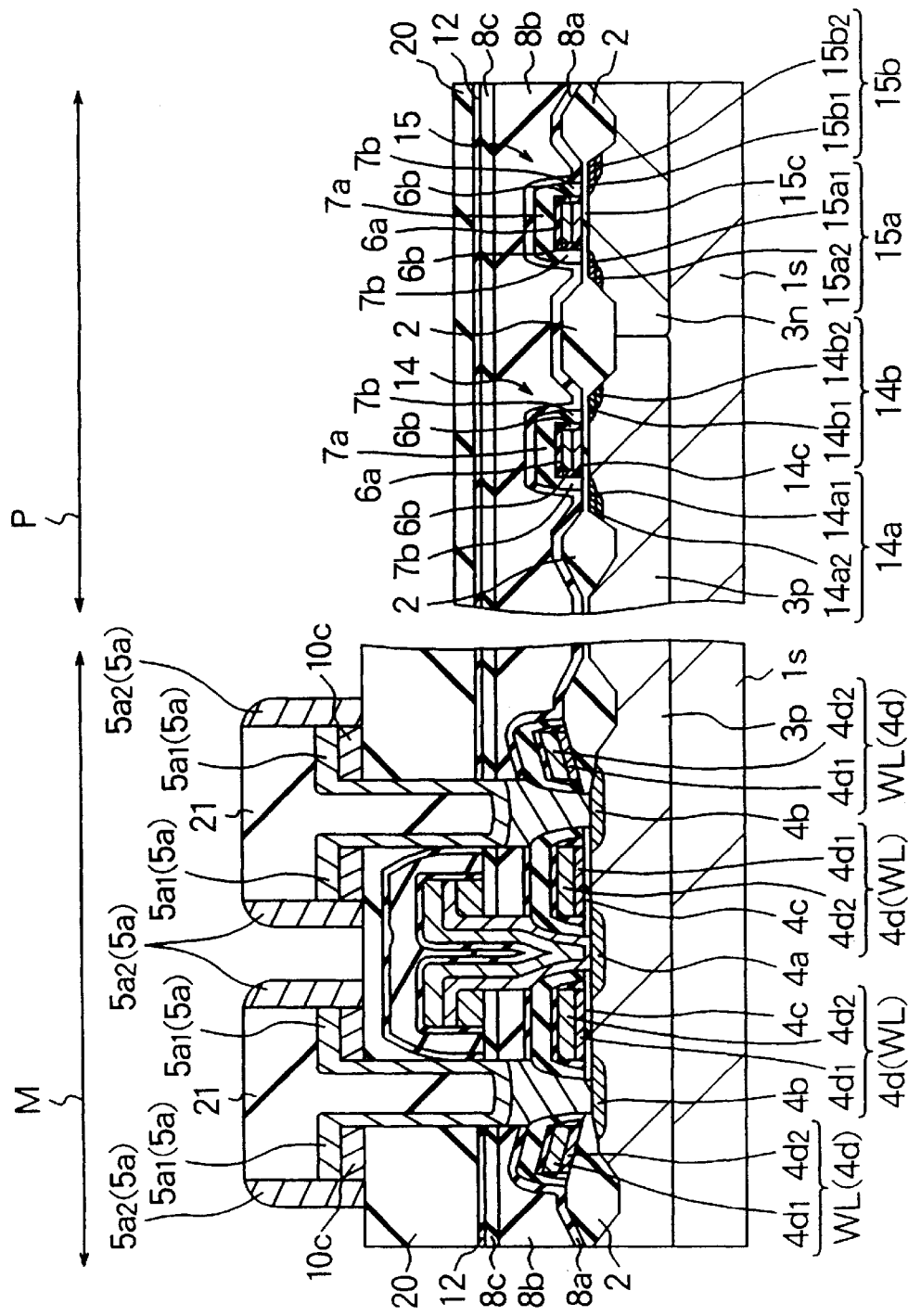

Thereafter, on the resulting semiconductor substrate 1s, a conductor film made of low-resistance poly-silicon is formed by using the CVD method. Thereafter, the conductor film is etched back by using an anisotropic dry etching method such as the RIE. Thereby, side portions 5a2 of the first electrode 5a of the capacitor are formed on side surfaces of the insulating film 21 as shown in FIG. 5t.

Subsequently, the insulating films 20 and 21 are removed by wet etching preferably using a fluoric acid solution. Thereby, the first electrode 5a of a cylindrical capacitor is formed as shown in FIG. 5u. At this time, the insulating film 12 formed on the inter-layer insulating film 8c functions as the stopper for the wet etching and consequently the underlying inter-layer insulating film 8c is not removed.

Subseuently, on the resulting semiconductor substrate 1s, a silicon nitride film (not illustrated) is formed by using the CVD method as shown in FIG. 5v. Thereafter, the silicon nitride film is subjected to oxidation processing. Thereby, a $SiO_2$ film is formed on the surface of the silicon nitride film, and the capacitor insulating film 5b including the silicon nitride film and the $SiO_2$ film is formed.

Thereafter, a conductor film preferably made of low-resistance poly-silicon is formed on the resulting semiconductor substrate 1s by using the CVD method. By using a photoresist as a mask, this conductor film is etched. Thereby the second electrode 5c of the capacitor 5 is formed, and the capacitor 5 is formed.

Subsequently, on the resulting semiconductor substrate 1s, the insulating film preferably made of $SiO_2$ is formed by using the CVD method. Thereafter, on the insulating film 8d1, the insulating film 8d2 preferably made of BPSG is formed. The upper surface of the insulating film 8d2 is flattened preferably by using the CMP method.

Subsequently, transition to wiring conductor forming process is conducted. The wiring conductor forming process will now be described by referring to FIGS. 5w through 5z. Although FIGS. 5w through 5z show sectional views of a portion different from that of FIGS. 5a through 5v to explain the wiring conductor forming process, FIGS. 5w through 5z are sectional views of the same DRAM.

First of all, an inter-layer insulating film 8e preferably made of $SiO_2$ is formed on the resulting semicondutor substrate by using the CVD method as shown in FIG. 5w. Thereby the capacitor 5 is covered.

By using a photoresist as a mask, a contact hole 22a is formed in the inter-layer insulating film 8e so as to expose a pad portion of the second electrode 5c of the capacitor 5. Together therewith, a contact hole 22b is formed by using dry etching processing so as to expose one semiconductor region 23a of a MOSFET 23 in the peripheral circuit region P.

Thereafter, on the resulting semiconductor substrate 1s, a conductor film preferably made of titanium (Ti) is formed by the sputtering method. On the upper surface of the conductor film, a conductor film preferably made of tungsten is then formed by using the CVD method. On the upper surface of the conductor film preferably made of tungsten, a conductor film preferably made of titanium nitride (TiN) is formed by using the sputtering method.

Subsequently, with a photoresist used as a mask, the laminated conductor film is subjected to patterning by using the dry etching method. Thereby, a first level interconnection 24a is formed as shown in FIG. 5x.

Subsequently, on the resulting semiconductor substrate 1s, an inter-layer insulating film 8f preferably made of $SiO_2$ is formed by using the CVD method so as to cover the first level interconnection 24a. Thereafter, the inter-layer insulating film 8f is subjected to dry etching processing by using a photoresist as a mask. Thereby, a contact hole 22c is formed so as to expose a part of the first level interconnection 24a.

Figure 5Y:
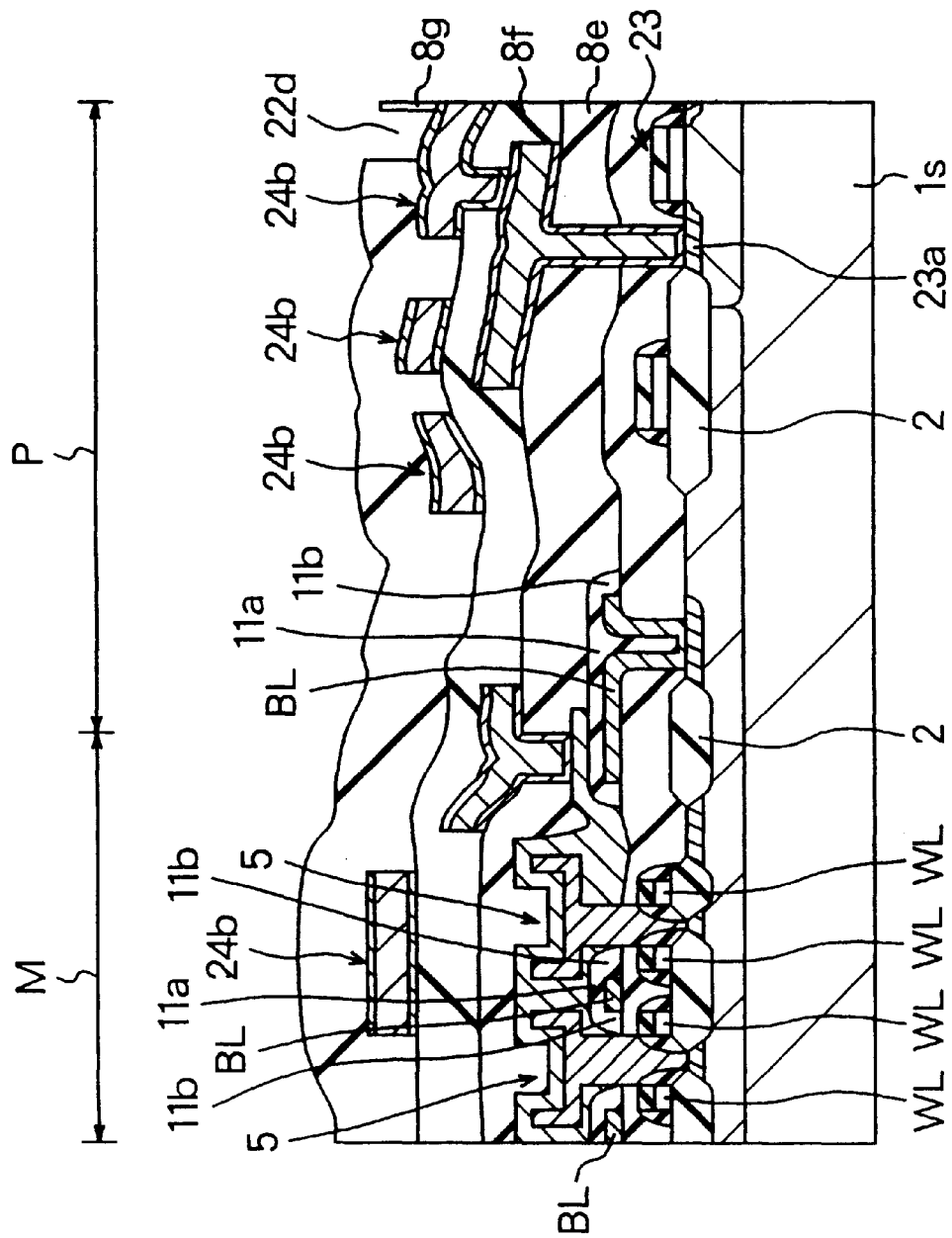
Figure 5Z:
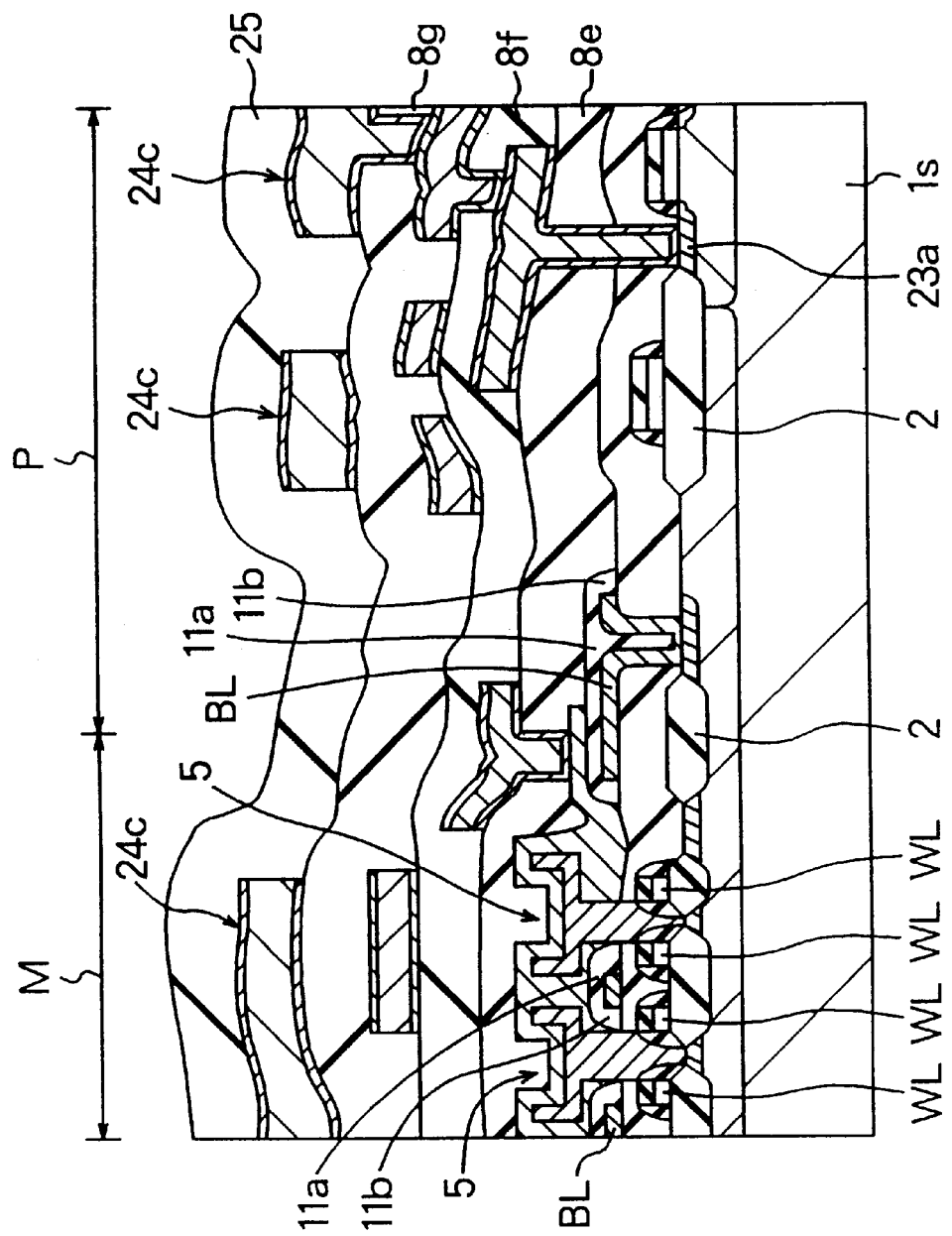

Thereafter, a second level interconnection 24b is formed on the inter-layer insulating film 8f as shown in FIG. 5y. The second level interconnection 24b is formed preferably as described below.

First of all, a conductor film preferably made of tungsten is formed by using the CVD method. On the upper surface of the conductor film, a conductor film preferably made of aluminum (Al) is formed by using the sputtering method. Furthermore, on the upper surface of the conductor film preferably made of aluminum, a conductor film preferably made of TiN is formed by using the sputtering method. Thereafter, the laminated conductor film is subjected to patterning in the same way as the first level interconnection 24a. The second level interconnection 24b is thus formed.

Subsequently, on the inter-layer insulating film 8f, an inter-layer insulating film 8g preferably made of $SiO_2$ is formed to cover the second level interconnection 24b by using the CVD method. Therafter, by using a photoresist as a mask, the inter-layer insulating film 8g is subjected to dry etching processing. Thereby, a contact hole 22d is formed so as to expose the second level interconnection 24b.

Subsequently, a third level interconnection 24c is formed on the inter-layer insulating film 8g as shown in FIG. 5z. The third level interconnection 24c may be formed by the same material and the same method as the second level interconnection 24b uses.

Finally, on the resulting semiconductor substrate 1s, a surface protection film 25 preferably made of $SiO_2$ is formed to cover the third level interconnection 24c by using the CVD method. Thereby, the wafer process of the DRAM in the present first embodiment is finished.

Owing to the present first embodiment, the following effects can thus be obtained.

(1) Since the bit line contact hole 9a1 and the capacitor contact holes 9b1 and the capacitor contact holes 9b1 and 9b2 can be formed in a self-aligning manner, it becomes possible to make alignment in photolithography between those contact holes 9a1, 9b1 and 9b2 and each layer.

(2) By making the etching selection ratio of the insulating films (the film 5b of FIG. 5i and the film 20 of FIG. 5p) covering the cap insulating film and the side walls (the films 7a and 7b of FIG. 5i and the films 11a and 11b of FIG. 5p) with respect to the cap insulating film and the side walls, the upper surface of the underlying insulating film (the film 8b of FIG. 5g and the film 20 of FIG. 5p) can be flattened in forming the bit line contact hole 9a1 and the capacitor contact holes 9b1 and 9b2. Therefore, the margin in the photolithography for forming the contact holes 9a1, 9b1 and 9b2 can be improved and the pattern transferrence precision can be improved.

(3) Because of (1) and (2), the slignment tolerance of the bit line contact hole 9a1 and the capacitor contact holes 9b1 and 9b2 can be reduced. Therefore, the size of the memory cell MC can be reduced. As a result, the size of the semiconductor chip can be reduced.

(4) Because of (1) and (2), contact faults in the bit line contact hole 9a1 and the capacitor contact holes 9b1 and 9b2 can be reduced. Therefore, the yield and reliability of the DRAMs can be improved.

(5) Because of (1) and (2), any sophiscated aligning technique or process control is not required for forming the bit line contact hole 9a1 and the capacitor contact holes 9b1 and 9b2. Furthermore, it is not necessary to introduce a sophisticated and expensive photolithography technique such as the phase shift technique for enhancing the resolution of the transcription pattern.

(6) The cap insulating film 7a and the side walls 7b of the memory cell region M can be formed concurrently with the cap insulating film 7a and the side walls 7b for forming the LDD structure of the MOSFET in the peripheral circuit region P. A significant increase in manufactiong process is not caused.

(7) Because of (5) and (6), the time of period for developing the semiconductor devices having DRAMs can be shortened.

Figure 7:
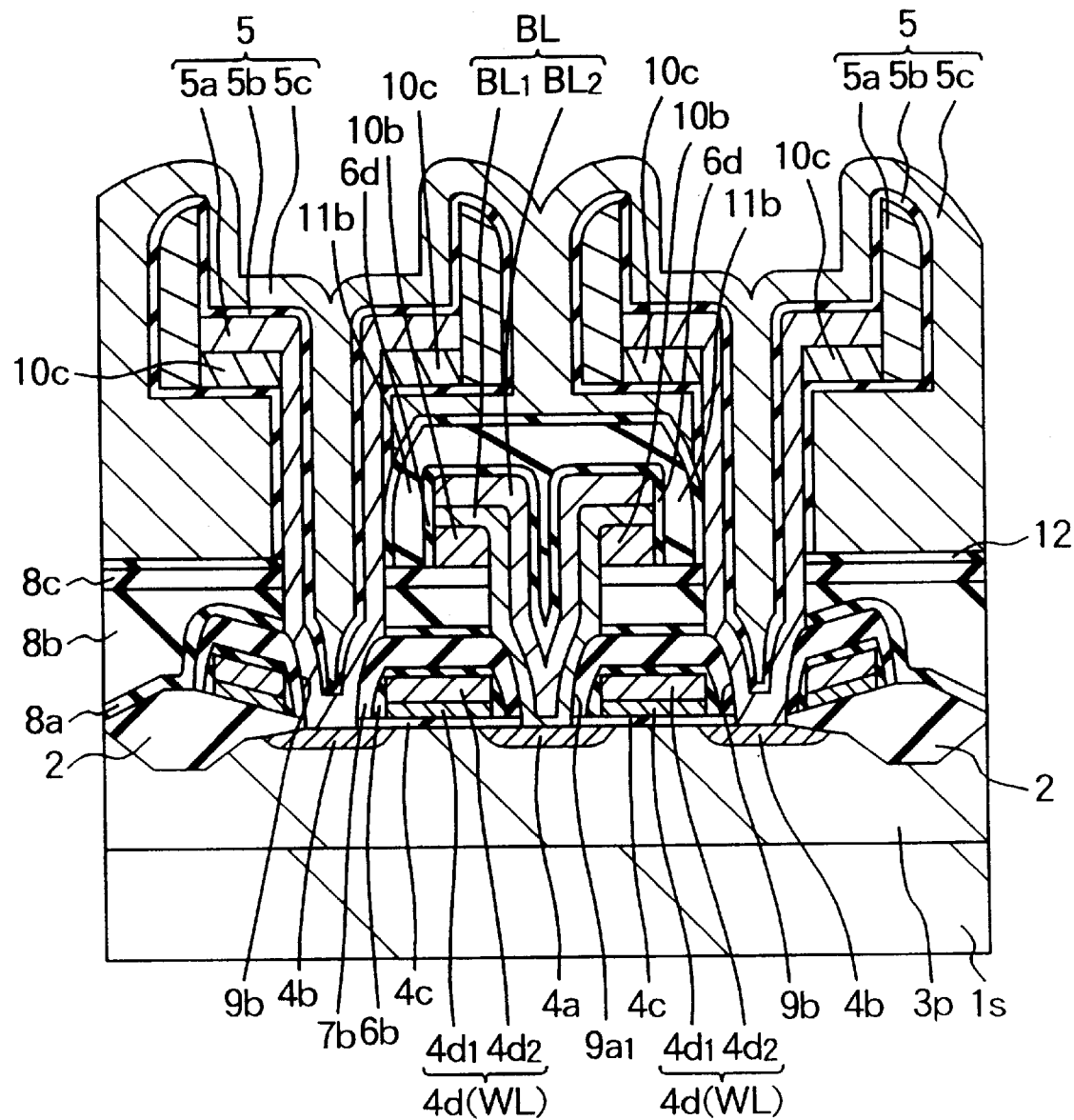
FIG. 7 is a sectional view of a principal portion of a memory cell region included in an embodiment of a semiconductor device according to the present invention.

FIG. 7 is a sectional view of a principal part of the memory cell region of another embodiment of a semiconductor device according to the present invention.

In the semiconductor device of the second embodiment shown in FIG. 7, the conductor film 13 to be embedded as described with reference to the first embodiment is not provided in the contact hole 9b1 for the capacitor 5.

In this case, the contact hole 9b1 is formed preferably as hereafter described. A transition from the stage of FIG. 5f in the first embodiment to the stage of FIG. 5l is effected. Furthermore, in the same way as the procedures shown in FIGS. 5m through 5o, the bit line BL, the insulating films 6c and 6d covering the bit line BL, the cap insulating film 11a, the side walls 11b, and the the insulating film 12 are formed.

Subsequently, the insulating film 12 is covered with the insulating film 20 in the same way as the procedure shown in FIG. 5p. Thereafter, the upper surface of the insulating film 20 is flattened. Thereafter, the mask film 10c preferably made of low-resistance poly-silicon is formed on the insulating film 20. By using the mask film 10c as a mask, the contact hole 9b is formed in the insulating film 20, the insulating film 12 and the inter-layer insulating films 8a through 8c so as to expose the semiconductor region 4b located on the resulting semiconductor substrate 1s by using the dry etching method in the same way as the procedure shown in FIG. 5q.

In the present second embodiment as well, the contact hole 9b can be formed in a self-aligning manner at this time by forming the cap insulating film 7a and the side walls 7b covering the word line WL and the cap insulating film 11a and the side walls 11b covering the bit line BL by using silicon nitride.

Therefore, the same effects as the first embodiment provides can be obtained in the present second embodiment as well.

Heretofore, the invention made by the present inventors has been described concretely on the basis of preferred embodiments. As a matter of course, however, the present invention is not limited to the first and second embodiments, but the present invention can be modified diversely without departing from the spirit of the present invention.

By referring to the first and second embodiments, the case where the memory cell has a cylindrical capacitor has been described. However, the shape of the capacitor is not limited to this, but it can be modified diversely and the capacitor may take the shape of a fin.

By referring to the first and second embodiments, the case where the bit line is formed by disposing a silicide layer on low-resistance poly-silicon has been described. However, the structure of the bit line is not limited to this. For example, the bit line may be formed by using the silicide layer alone. In this case, the bit line BL can be made thin.

By referring to the first and second embodiments, the case where both the word line and the bit line are covered with the cap insulating film and the side walls each made of silicon nitride has been described. However, covering is not limited to this, but it can be modified diversely. For example, the word line alone may be covered with the cap insulating film and the side walls made of silicon nitride. Or the bit line alone may be covered with the cap insulating film and the side walls made of silicon nitride.

Heretofore, the case where the invention made by the present inventors is applied to DRAMs forming its background field has been principally described. However, application is not limited to this, but the present invention can be applied to various fields. For example, the present invention can be applied to SRAMs, ROMs, logic circuits, or other semiconductor devices having a semiconductor memory circuit and a logic circuit disposed on the same semiconductor substrate.

What is claimed is:

1. A method of manufacturing a semiconductor device comprising the steps of:

forming a plurality of wiring conductors over a semiconductor substrate;

covering upper and side surfaces of said K wiring conductors with first insulating films;

forming a second insulating film on the resulting semicondutor substrate to cover therewith said first insulating film, said second insulating film having a flat upper surface and including a material larger in etching rate than a material of said first insulating film;

forming a mask film on the flat upper surface of said second insulating film, said mask film including a material smaller in etching rate than a material of said second insulating film, and thereafter forming openings in contact hole forming regions of said mask film located between said plurality of wiring conductors adjacent to each other; and forming contact holes by etching and removing a part of said second insulating film exposed in the opening regions of said mask film, said contact holes being defined by said first insulating films in self-alignment.

2. A method according to claim 1, further comprising the step of:

embedding a conductor film in said contact holes by forming the conductor film on the resulting semiconductor substrate after forming said contact holes and then etching back the conductor film.

3. A method according to claim 2, wherein said first insulating film is made of silicon nitride, and each of said mask layer and said conductor film is made of a low-resistance poly-silicon.

4. A method of manufacturing a semiconductor device having a DRAM, said DRAM including word line conductors, bit line conductors and memory cells of a capacitor over bit line structure, each of said word line conductors functioning also as a gate electrode of a memory cell selection MISFET formed on a semiconducor substrate, each of said bit line conductors being disposed over said word line conductors so as to transverse said word line conductors, each of said memory cells of the capacitor over bit line structure including an information storing capacitor over said bit line conductors, the method comprising the steps of:

forming a plurality of word line conductors over a semiconductor substrate;

covering upper and side surfaces of said word line conductors with first insulating films;

forming a second insulating film on the resulting semicondutor substrate to cover therewith said first insulating films, said second insulating film having a flat upper surface and including a material larger in etching rate than a material of said first insulating films;

forming a first mask film on the flat upper surface of said second insulating film, said first mask film including a material smaller in etching rate than a material of said second insulating film, and thereafter forming openings in lower capacitor contact hole forming regions of said first mask film located between word line conductors adjacent to each other;

forming lower capacitor contact holes each to expose a first semiconductor region of said memory cell selection MISFET by etching and removing a part of said second insulating film exposed in the opening region of said first mask film, said lower capacitor contact holes being defined by said first insulating films in self-alignment; and embedding a first conductor film in each of said lower capacitor contact holes by forming a first conductor film on the resulting semiconductor substrate after forming said lower capacitor contact holes and then etching back the first conductor film.

5. A method of manufacturing a semiconductor device having a DRAM, said DRAM including word line conductors, bit line conductors and memory cells of a capacitor over bit line structure, each of said word line conductors functioning also as a gate electrode of a memory cell selection MISFET formed on a semiconducor substrate, each of said bit line conductors being disposed over said word line conductors so as to transverse said word line conductors, each of said memory cells of the capacitor over bit line structure including an information storing capacitor over said bit line conductors, the method comprising the steps of:

forming a plurality of word line conductors over a semiconductor substrate;

covering upper and side surfaces of said word line conductors with first insulating films;

forming a second insulating film on the resulting semiconductor substrate to cover therewith said first insulating films, said second insulating film having a flat upper surface and including a material larger in etching rate than a material of said first insulating films;

forming a second mask film on the flat upper surface of said second insulating film, said second mask film including a material smaller in etching rate than a material of said second insulating film, and thereafter forming openings in bit line contact hole forming regions of said second mask film located between said word line conductors adjacent to each other;

forming bit line contact holes each to expose a first semiconductor region of said memory cell selection MISFET by etching and removing a part of said second insulating film exposed in the opening region of said second mask film, said bit line contact holes being defined by said first insulating films in self-alignment; and forming said bit line conductors by forming a second conductor film on the resulting semiconductor substrate after forming said bit line contact holes and then patterning said second conductor film.

6. A method according to claim 5, further comprising the steps of:

covering upper and side surfaces of said bit line conductors with third insulating films;

forming a fourth insulating film on said second insulating film to cover therewith said third insulating films, said fourth insulating film having a flat upper surface and including a material larger in etching rate than a material of said third insulating films;

forming a third mask film on the flat upper surface of said fourth insulating film, said third mask film including a material smaller in etching rate than a material of said fourth insulating film, and thereafter forming openings in capacitor contact hole forming regions of said third mask film located between the word line conductors adjacent to each other and between the bit line conductors adjacent to each other;

forming capacitor contact holes each to expose a second semiconductor region of said memory cell selection MISFET by etching and removing a part of said second insulating film and a part of said fourth insulating film exposed in the opening region of said third mask film, said capacitor contact holes being defined by said first insulating films and said third insulating films in self-alignment manner; and forming a part of a first electrode of each of said information storing capacitors by forming a third conductor film on the resulting semiconductor substrate after forming said capacitor contact holes and then patterning said third conductor film.

7. A method according to claim 6, wherein said DRAM has a peripheral circuit including a plurality of MISFETs, and said first insulating films are formed simultaneously with insulating films formed on upper and side surfaces of gate electrodes of MISFETs in the peripheral circuit.

8. A method according to claim 6, wherein each of said first insulating films and said third insulating films are made of silicon nitride, and each of said second mask film, said third mask film, said second conductor film and said third conductor film is made of a low-resistance silicon.

9. A method of manufacturing a semiconductor device having a DRAM, said DRAM including word line conductors, bit line conductors and memory cells of a capacitor over bit line structure, each of said word line conductors functioning also as a gate electrode of a memory cell selection MISFET formed on a semiconducor substrate, each of said bit line conductor being disposed over said word line conductors so as to transverse said word line conductors, each of said memory cells of the capacitor over bit line structure including an information storing capacitor over said bit line conductors, the method comprising the steps of:

forming a plurality of word line conductors over a semiconductor substrate;

covering upper and side surfaces of said word line conductors with first insulating films;

forming a second insulating film on the resulting semicondutur substrate to cover therewith said first insulating films, said second insulating film having a flat upper surface and including a material larger in etching rate than a material of said first insulating films;

forming a first mask film on the flat upper surface of said second insulating film, said first mask film including a material smaller in etching rate than a material of said second insulating film, and thereafter forming openings in lower capacitor contact hole forming regions of said first mask film located between word line conductors adjacent to each other;

forming lower capacitor contact holes each to expose a first semiconductor region of said memory cell selection MISFET by etching and removing a part of said second insulating film exposed in the opening region of said first mask film, said lower capacitor contact holes being defined by said first insulating films in self-alignment;

embedding first conductor films in said lower capacitor contact holes by forming a first conductor film on the resulting semiconductor substrate after forming said lower capacitor contact holes and then etching back the first conductor film;

forming a third insulating film on the flat surface of said second insulating film after said step of embedding said first conductor film, said third insulating film having a substantially flat upper surface;

forming a second mask film on said third insulating film, said second mask film including a material smaller in etching rate than a material of said second insulating film and said third insulating film, and thereafter forming openings in bit line contact hole forming regions of said second mask film located between said word line conductors adjacent to each other;

forming bit line contact holes each to expose a second semiconductor region of said memory cell selection MISFET by etching and removing a part of each of said third insulating film and said second insulating film exposed in the opening region of said second mask film, said bit line contact holes being defined by said first insulating film in self-alignment; and forming said bit line conductors by forming a second conductor film on the resulting semiconductor substrate after forming said bit line contact holes and then patterning said second conductor film.

10. A method according to claim 9, wherein said DRAM has a peripheral circuit including a plurality of MISFETs, and said first insulating films are formed simultaneously with insulating film formed on upper and side surfaces of gate electrodes of MISFETs in the peripheral circuit.

11. A method according to claim 9, wherein each of said first mask film, said second mask film, said first conductor films and said second conductor films are made of a low-resistance silicon.

12. A method according to claim 9, further comprising the steps of:

covering upper and side surfaces of said bit line conductors with fourth insulating films;

forming a fifth insulating film on said third insulating film to cover therewith said fourth insulating films, said fifth insulating film having a flat upper surface and including a material larger in etching rate than a material of said fourth insulating films;

forming a third mask film on the flat upper surface of said fifth insulating film, said third mask film including a material smaller in etching rate than a material of said fifth insulating film, and thereafter forming openings in upper capacitor contact hole forming regions of said third mask film located;

forming upper capacitor contact holes each to expose said first conductor film embedded in its associated one of said lower capacitor contact holes by etching and removing a part of said fifth insulating film and a part of said third insulating film exposed in the opening region of said third mask film, said upper capacitor contact holes being defined by said fourth insulating films in self-alignment; and forming a part of a first electrode of each of said information storing capacitors by forming a third conductor film on the resulting semiconductor substrate after forming said upper capacitor contact holes and then patterning said third conductor film.

13. A method according to claim 12, wherein said DRAM has a peripheral circuit including a plurality of MISFETs, and said first insulating films are formed simultaneously with insulating films formed on upper and side surfaces of a gate electrodes of said MISFETs in the peripheral circuit.

14. A method according to claim 12, wherein each of said first insulating films and said fourth insulating films is made of silicon nitride, and each of said first mask film, said second mask film, said third mask film, said first conductor film, said second conductor film and said third conductor film is made of a low-resistance silicon.

15. A method of manufacturing a semiconductor device having a DRAM, said DRAM including word line conductors, bit line conductors and memory cells of a capacitor over bit line structure, each of said word line conductors functioning also as a gate electrode of a memory cell selection MISFET formed on a semiconducor substrate, each of said bit line conductors being disposed over said word line conductors so as to transverse said word line conductors, each of said memory cells of the capacitor over bit line structure including an information storing capacitor over said bit line conductors, the method comprising the steps of:

covering upper and side surfaces of said bit line conductor with first insulating films;

forming a third insulating film on the resulting semiconductor substrate to cover therewith said first insulating films, said third insulating film having a flat upper surface and including a material larger in etching rate than a material of said first insulating films;

forming a mask film on the flat upper surface of said third insulating film, said mask film including a material smaller in etching rate than a material of said third insulating film, and thereafter forming openings in capacitor contact hole forming regions of said mask film located between the bit line conductors adjacent to each other;

forming capacitor contact holes each to expose a first semiconductor region of said memory cell selection MISFET by etching and removing a part of said third insulating film exposed in the opening region of said mask film, said capacitor contact holes being defined by said first insulating films in self-alignment; and forming a part of a first electrode of each of said information storing capacitors by forming a conductor film on the resulting semiconductor substrate after forming said capacitor contact holes and then patterning said conductor film.

16. A method according to claim 15, wherein said first insulating film is made of silicon nitride.

17. A method of manufacturing a semiconductor device comprising the steps of:

forming first conductors over a main surface of a semiconductor substrate with a first insulating film interposed therebetween;

forming semiconductor regions in said main surface of the semiconductor substrate on both sides of said first conductors;

covering upper and side surfaces of said first conductors with second insulating films;

forming a third insulating film on the resulting substrate with said second insulating films being contacted with and underlying said third insulating film, said third insulating film having an etching rate larger than that of said second insulating film;

flattening an upper surface of said third insulating film; and forming first contact holes by etching through said third insulating film having said flattened upper surface for predetermined ones of said semiconductor regions, wherein said flattened upper surface of said third insulating film enhances a resolution for said first contact holes and said second insulating film serves to limit excessive etching for said first contact holes owing to its relatively lower etching rate.

18. A method according to claim 17, further comprising the steps of:

filling said first contact holes with a conductive material;

forming a fourth insulating film on said conductive material and on said second insulating films having said flattened upper surface, with a result that said fourth insulating film has a generally flattened surface; and forming second contact holes by etching through said fourth and third insulating film for remaining ones of said semiconductor regions, wherein said flattened surface of said fourth insulating film enhances a resolution for said second contact holes and said second insulating film serves to limit excessive etching for said second contact holes owing to its relatively lower etching rate.

19. A method according to claim 18, further comprising the steps of:

forming second conductors extending to contact with said remaining semiconductor regions through said second contact holes and extending on said fourth insulating film in a direction transverse to said first conductors;

covering upper and side surfaces of said second conductors with fifth insulating films;

forming a sixth insulating film on said fourth insulating film and on said fifth insulating films with said fifth insulating films being contacted with and underlying said sixth insulating film, said sixth insulating film having an etching rate larger than that of said fifth insulating film;

flattening an upper surface of said sixth insulating film;

forming extension holes by etching through said sixth insulating film having said flattened upper surface and through said fourth insulating films, wherein said flattened surface of said sixth insulating film enhances a resolution for said extension holes and said fifth insulating films serve to limit excessive etching for said extension contact holes owing to its relatively lower etching rate, said extension holes reaching said conductive material in said first contact holes;

forming conductive films on said conductive materials in said first contact holes and on inner walls of said extension holes; and forming capacitors over said second conductors, with said conductive films on said conductive materials in said first contact holes used as electrodes of said capacitors.

20. A method of manufacturing a semiconductor device comprising the steps of:

forming first conductors over a main surface of a semiconductor substrate with a first insulating film interposed therebetween;

forming semiconductor regions in said main surface of the semiconductor substrate on both sides of said first conductors;

covering upper and side surfaces of said first conductors with a second insulating films;

forming a third insulating film on the resulting substrate with said second insulating films being contacted with and underlying said third insulating film, said third insulating film having an etching rate larger than that of said second insulating film;

flattening an upper surface of said third insulating film;

forming first contact holes by etching through said third insulating film for predetermined ones of said semiconductor regions, wherein said flattened surface of said third insulating film enhances a resolution for said first contact holes and said second insulating film serves to limit excessive etching for said first contact holes owing to its relatively lower etching rate;

forming second conductors extending to contact with said predetermined semiconductor regions through said first contact holes and extending on said third insulating film in a direction transverse to said first conductors;

covering upper and side surfaces of said second conductors with a fourth insulating films;

forming a fifth insulating film on said third insulating film and on said fourth insulating films with said fourth insulating films being contacted with and underlying said fifth insulating film, said fifth insulating film having an etching rate larger than that of said fourth insulating film;

flattening an upper surface of said fifth insulating film; and forming second contact holes by etching through said fifth insulating film having said flattened upper surface and through said third insulating films for remaining ones of said semiconductor regions, wherein said flattened surface of said fifth insulating film enhances a resolution for said second contact holes and said second insulating film and said third insulating film serve to limit excessive etching for said extension contact holes in widthwise directions of said first conductors and said second conductors, respectively, owing to their relatively lower etching rates, said second contact holes reaching said remaining semiconductor regions.

21. A method according to claim 20, further comprising the steps of:
   forming conductive films on said remaining semiconductor regions and on inner walls of said second contact holes; and
   forming capacitors over said second conductors, with said conductive films used as electrodes of said capacitors.

22. A method of manufacturing a semiconductor device comprising the steps of:
   forming first conductors over a main surface of a semiconductor substrate with a first insulating film interposed therebetween;
   forming semiconductor regions in said main surface of the semiconductor substrate on both sides of said first conductors;
   covering upper and side surfaces of said first conductors with second insulating films;
   forming a third insulating film on the resulting substrate with said second insulating films being contacted with and underlying said third insulating film, said third insulating film having an etching rate larger than that of said second insulating films;
   flattening an upper surface of said third insulating film;
   forming a first patterned mask film on the flattened upper surface of said third insulating film;
   forming first contact holes by etching through said third insulating film having said flattened upper surface for predetermined ones of said semiconductor regions, using said first patterned mask film, wherein said second insulating films serve to limit excessive etching of said first contact holes in a widthwise direction of said first conductors owing to its relatively lower etching rate;
   filling said first contact holes with a conductive material;
   forming a fourth insulating film on said conductive material and on said second insulating films with a result that said fourth insulating film has a generally flattened surface;
   forming a second patterned mask film on said fourth insulating film;
   forming second contact holes by etching through said fourth and third insulating film for remaining ones of said semiconductor regions, using said second patterned mask film, wherein said flattened surface of said fourth insulating film enhances a resolution for said second contact holes and said second insulating film serves to limit excessive etching for said second contact holes in a widthwise direction of said first conductors owing to its relatively lower etching rate;
   forming second conductors extending to contact with said remaining semiconductor regions through said second contact holes and extending on said fourth insulating film in a direction transverse to said first conductors;
   covering upper and side surfaces of said second conductors with a fifth insulating films;
   forming a sixth insulating film on said fourth insulating film and on said fifth insulating films with said fifth insulating films being contacted with and underlying said sixth insulating film, said sixth insulating film having an etching rate larger than that of said fifth insulating film;
   flattening an upper surface of said sixth insulating film;
   forming a third patterned mask film on the flattened upper surface of said sixth insulating film;
   forming extension holes by etching through said sixth insulating film having said flattened upper surface and through said fourth insulating films, using said third patterned mask film, wherein said flattened surface of said sixth insulating film enhances a resolution for said extension holes and said fifth insulating films serve to limit excessive etching for said extension holes in a widthwise direction of said second conductors owing to its relatively lower etching rate, said extension holes reaching said conductive material in said first contact holes;
   forming conductive films on said conductive materials in said first contact holes and on inner walls of said extension holes; and
   forming capacitors over said first conductors, with said conductive films on said conductive materials in said first contact holes used as electrodes of said capacitors.

23. A method of forming a semiconductor device having a memory array, said memory array including word line conductors, bit line conductors and memory cells, each of said memory cells including a memory cell selection MISFET and a capacitor element, each of said word line conductors functioning as a gate electrode of a memory cell selection MISFET and is formed on a semiconductor substrate, each of said bit line conductors being disposed over said word line conductors so as to transverse said word line conductors, said method comprising:
   forming word line conductors over the semiconductor substrate;
   implanting impurities in said semiconductor substrate at both sides of said word line conductors, so as to form a source region and a drain region of said memory cell selection MISFET;
   covering upper and side surfaces of said word line conductors with a first insulating film;
   forming a second insulating film over the semiconductor substrate to cover said first insulating film;
   forming a first contact hole in said second insulating film by a dry etching method under conditions that the etching rate of said second insulating film is larger than that of said first insulating film;
   forming bit line conductors over said second insulating film, one of said bit line conductors being electrically connected to one of the source and drain regions of said memory cell selection MISFET via said first contact hole;
   covering upper and side surfaces of said bit line conductors with a third insulating film;
   forming a fourth insulating film over the semiconductor substrate to cover said third insulating film;
   forming a second contact hole in said fourth insulating film by a dry etching method under conditions that the etching rate of said fourth insulating film is larger than that of said third insulating film; and
   forming over said fourth insulating film a conductive film as one electrode of said capacitor element, said conductive film being electrically connected to the other of the source and drain regions of said memory cell selection MISFET via said second contact hole.

24. A method of manufacturing a semiconductor device according to claim 23, wherein each of said first and third insulating films comprises a silicon nitride film, and each of said second and fourth insulating films comprises a silicon oxide film.

25. A method of manufacturing a semiconductor device according to claim 24, wherein said first contact hole is formed in self-aligned manner with one of said word line conductors, and said second contact hole is formed in self-aligned manner with one of said bit line conductors.

26. A method of forming a semiconductor device having a memory array, said memory array including word line conductors, bit line conductors and memory cells, each of said memory cells including a memory cell selection MISFET and a capacitor element, each of said word line conductors functioning as a gate electrode of a memory cell selection MISFET and is formed on a semiconductor substrate, each of said bit line conductors being disposed over said word line conductors so as to transverse said word line conductors, said method comprising:

forming word line conductors over the semiconductor substrate;

covering upper and side surfaces of said word line conductors with a first insulating film;

forming a second insulating film over the semiconductor substrate to cover said first insulating film;

forming bit line conductors over said second insulating film;

covering upper and side surfaces of said bit line conductors with a third insulating film;

forming a fourth insulating film over the semiconductor substrate to cover said third insulating film;

forming a contact hole in said second and fourth insulating films by a dry etching method under conditions that the etching rate of said second and fourth insulating films is larger than that of said first and third insulating films; and forming over said fourth insulating film a conductive film as one electrode of said capacitor element, said conductive film being electrically connected to said memory cell selection MISFET via said contact hole.

27. A method of manufacturing a semiconductor device according to claim 26, wherein each of said first and third insulating films comprises a silicon nitride film, and each of said second and fourth insulating films comprises a silicon oxide film.

28. A method of manufacturing a semiconductor device according to claim 27, wherein said contact hole is formed in a self-aligned manner with one of said bit line conductors and one of said word line conductors.

29. A method of forming a semiconductor device having a memory array, said memory array including word line conductors, bit line conductors and memory cells, each of said memory cells including a memory cell selection MISFET and a capacitor element, each of said word line conductors functioning as a gate electrode of a memory cell selection MISFET and is formed on a semiconductor substrate, each of said bit line conductors being disposed over said word line conductors so as to transverse said word line conductors, said method comprising:

forming word line conductors over the semiconductor substrate;

implanting impurities in said semiconductor substrate at both sides of said word line conductors, so as to form a source region and a drain region of said memory cell selection MISFET;

covering upper and side surfaces of said word line conductors with a first insulating film;

forming a second insulating film over the semiconductor substrate to cover said first insulating film;

forming a first contact hole in said second insulating film by a dry etching method under conditions that the etching rate of said second insulating film is larger than that of said first insulating film;

forming a first conductive film in said first contact hole;

forming a second contact hole in said second insulating film by a dry etching method under conditions that the etching rate of said second insulating film is larger than that of said first insulating film;

forming bit line conductors over said second insulating film, one of said bit line conductors being electrically connected to one of the source and drain regions of said memory cell selection MISFET via said second contact hole;

covering upper and side surfaces of said bit line conductors with a third insulating film;

forming a fourth insulating film over the semiconductor substrate to cover said third insulating film;

forming a third contact hole in said fourth insulating film by a dry etching method under conditions that the etching rate of said fourth insulating film is larger than that of said third insulating film, so as to expose a surface of said first conductive film; and forming over said fourth insulating film a second conductive film as one electrode of said capacitor element, said second conductive film being electrically connected to said first conductive film via said third contact hole.

30. A method of manufacturing a semiconductor device according to claim 29, wherein each of the first and third insulating films comprises a silicon nitride film, and each of said second and fourth insulating films comprises a silicon oxide film.

31. A method of manufacturing a semiconductor device according to claim 30, wherein said first and second contact holes are formed in a self-aligned manner with one of said word line conductors.

32. A method of manufacturing a semiconductor device according to claim 30, wherein said third contact hole is formed in a self-aligned manner with one of said bit line conductors.

* * * * *

UNITED STATES PATENT AND TRADEMARK OFFICE
CERTIFICATE OF CORRECTION

PATENT NO : 6,060,352
DATED : May 9, 2000
INVENTOR(S) : Toshihiro SEKIGUCHI, et al.

It is certified that error appears in the above-identified patent and that said Letters Patent are hereby corrected as shown below:

On title page, item 73 Assignee insert the following additional Assignee -- Texas Instruments, Incorporated, Dallas, Texas, U.S.A. --.

Signed and Sealed this

First Day of May, 2001

Attest:

NICHOLAS P. GODICI

Attesting Officer      Acting Director of the United States Patent and Trademark Office